US007551059B2

(12) United States Patent
Farrier

(10) Patent No.: US 7,551,059 B2
(45) Date of Patent: *Jun. 23, 2009

(54) HYBRID INFRARED DETECTOR ARRAY AND CMOS READOUT INTEGRATED CIRCUIT WITH IMPROVED DYNAMIC RANGE

(75) Inventor: Michael Farrier, Boyne City, MI (US)

(73) Assignee: Goodrich Corporation, Charlotte, NC (US)

( * ) Notice: Subject to any disclaimer, the term of this patent is extended or adjusted under 35 U.S.C. 154(b) by 225 days.

This patent is subject to a terminal disclaimer.

(21) Appl. No.: 11/303,769

(22) Filed: Dec. 16, 2005

(65) Prior Publication Data
US 2006/0181627 A1    Aug. 17, 2006

Related U.S. Application Data

(63) Continuation-in-part of application No. 11/030,843, filed on Jan. 6, 2005, now Pat. No. 7,518,645.

(51) Int. Cl.
H04N 3/14 (2006.01)
H04N 5/335 (2006.01)
H01L 27/00 (2006.01)
(52) U.S. Cl. ............... 340/300; 348/301; 250/208.1
(58) Field of Classification Search ......... 348/300–310; 257/294
See application file for complete search history.

(56) References Cited

U.S. PATENT DOCUMENTS 5,128,534 A    7/1992    Wyles et al. ............. 250/208.1
5,304,803 A *  4/1994    Sakaino et al. ............ 250/332

(Continued)

FOREIGN PATENT DOCUMENTS

WO    WO 2005011260    2/2005

OTHER PUBLICATIONS

Chih-Cheng Hsieh et al, "Focal Plan Arrays and CMOS Readout Techniques for Infrared Imaging Systems", IEEE Transactions on Circuits and Systems for Video Technology, vol. 7, No. 4 (Aug. 1997).

(Continued)

Primary Examiner—Kelly L. Jerabek
(74) Attorney, Agent, or Firm—McDonnell Boehnen Hulbert & Berghoff LLP

(57) ABSTRACT

A hybrid image sensor includes an infrared detector array and a CMOS readout integrated circuit (ROIC). The CMOS ROIC is coupled to at least one detector of the IR detector array, e.g., via indium bump bonding. Each pixel of the CMOS ROIC includes a first, relatively lower gain, wide dynamic range amplifier circuit which is optimized for a linear response to high light level input signals from the IR detector. Each pixel also includes a second, relatively higher gain, lower dynamic range amplifier circuit which is optimized to provide a high signal to noise ratio for low light level input signals from the IR detector (or from a second IR detector). A first output select circuit is provided for directing the output of the first circuit to a first output multiplexer. A second output select circuit is provided for directing the output of the second circuit to a second output multiplexer. Thus, separate outputs of the first and second circuits are provided for each of the individual pixel sensors of the CMOS imaging array.

18 Claims, 11 Drawing Sheets

U.S. PATENT DOCUMENTS

| | | | | |
|---|---|---|---|---|
| 6,011,251 | A | 1/2000 | Dierickx et al. | 250/208.1 |
| 6,486,504 | B1 | 11/2002 | Guidash | 257/222 |
| 6,593,562 | B1 | 7/2003 | Parrish et al. | 250/208.1 |
| 6,710,804 | B1 | 3/2004 | Guidash | 348/302 |
| 6,734,905 | B2 | 5/2004 | Fossum et al. | 348/300 |
| 6,757,018 | B1 | 6/2004 | Fowler | 348/301 |
| 2004/0251394 | A1* | 12/2004 | Rhodes et al. | 250/208.1 |
| 2005/0001143 | A1 | 1/2005 | Rhodes | 250/208.1 |
| 2005/0012168 | A1 | 1/2005 | Hong | 257/428 |
| 2005/0224843 | A1* | 10/2005 | Boemler | 257/233 |

OTHER PUBLICATIONS

O.Y. Pecht et al., "Wide Intrascene Dynamic Range CMOS APS Using Dual Sampling", IEEE Transactions on Electron Devices, vol. 44, No. 10 (Oct. 1997).

* cited by examiner

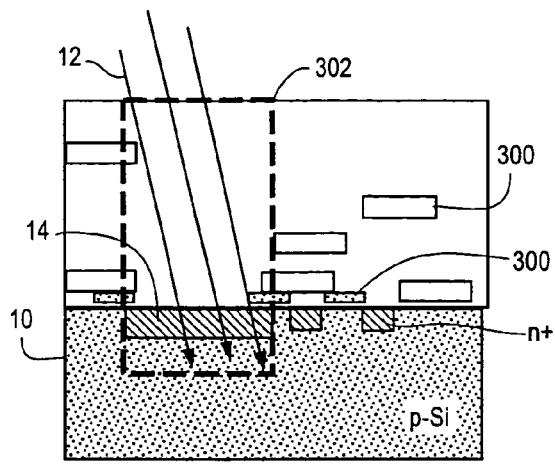
Fig. 12A
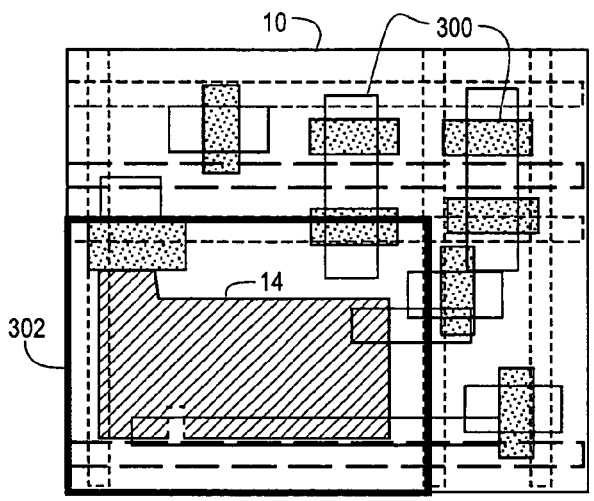
Fig. 12B
Fig. 13
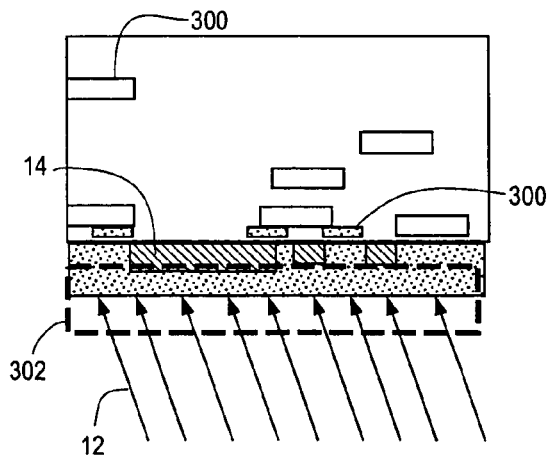
Fig. 14
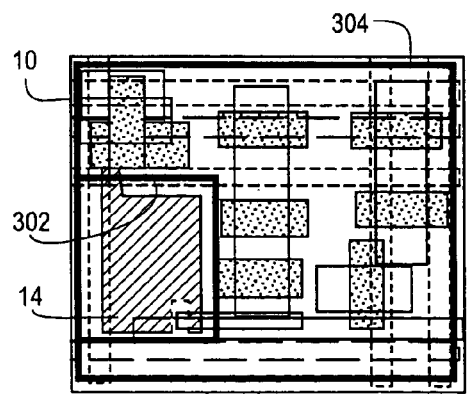

$T_{int}A^*$ = INTEGRATION TIME FOR CASE OF ONE DETECTOR, $T_{int}A$ = INTEGRATION TIME FOR CASE OF TWO DETECTORS PER PIXEL.

HYBRID INFRARED DETECTOR ARRAY AND CMOS READOUT INTEGRATED CIRCUIT WITH IMPROVED DYNAMIC RANGE

CROSS-REFERENCE TO RELATED APPLICATION

This is a continuation-in-part of prior U.S. application Ser. No. 11/030,843 filed Jan. 6, 2005, pending, the entire contents of which is incorporated by reference herein. Priority is hereby claimed to the '843 application.

BACKGROUND OF THE INVENTION

A. Field of the Invention

The present invention relates to solid state electronic image sensors and in particular to an Infra-Red (IR) focal plane readout integrated circuit. It is particularly suitable for application to airborne imaging systems, such as military aerial reconnaissance and surveillance image sensors.

B. Description of Related Art

Image sensors for capturing electronic representations of images in the visible wavelengths have been around since about 1970, when the silicon charge coupled device (CCD) was invented. Over the years, CCDs have become the standard for visible spectrum electronic imaging, replacing film in most applications. Various architectures have been developed to make CCD operation more effective for the specific application. Such architectures include the full frame, frame transfer, and interline transfer CCD.

The processes related to silicon CCD manufacturing have always been reasonably expensive and complex, with the implementation technology of choice being N type metal oxide (NMOS). The associated costs and operational characteristics of NMOS CCDs, and later P type (PMOS)CCDs, eventually persuaded designers to seek an image sensor solution using the more easily manufactured CMOS technology. CMOS had become the technology of choice utilized by most foundries for making computer integrated circuits.

The advantages of using CMOS for image sensors included having a wider selection of foundries, lower manufacturing costs, lower power/voltage operation, and especially the ability to add peripheral CMOS circuitry on the image sensor substrate, the later feature being attractive for developing an image sensor on a single chip. CMOS imagers therefore could have active circuitry added within the picture sensing element structure (pixel). These imagers became known as Active Pixel Sensors (APS). The APS CMOS image sensor (CIS) became feasible approximately ten years ago when CMOS processing technology advanced to the point of enabling minimum feature sizes small enough to meet the required pixel circuit density, while maintaining adequate optical aperture for a small pixel (diffraction limited) visible image sensor.

As CMOS image sensor technology continues to progress, the comparison of performance between the CCD and the CMOS image sensor has become an important topic of discussion by designers and end users. Today, CMOS imager development has yielded a sensor with characteristics close to that of the CCD, but still lacking in some respects. Overall, the CMOS APS has the advantage of lower cost and design flexibility, but has yet to fully match the performance of the CCD.

Currently, foundry-based CMOS image sensor technologies largely focus on manufacturing of low cost visible sensors for use in high volume consumer products, such as cell phones, PC cameras, toys, automotive sensors, camcorders and low cost SLR cameras. Consequently, the CMOS manufacturing technologies are largely the same as those used in manufacturing of high volume computer memory or mixed signal products. Few, if any, high volume commercial grade CMOS imaging products are manufactured using uniquely customized image sensor specific processes or complex pixel design technologies.

Although some CMOS imager foundries have begun to support unique process modifications to create specific process and design features for application specific integrated circuit (ASIC) clients, in nearly every case the custom CMOS image sensor technologies that enable these high performance applications are unique to the ASIC client, and not accessible to other users.

Improvements are disclosed herein in an APS CMOS imager which improve the dynamic range of the CMOS image sensor such that it meets or exceeds current customer expectations for imager sensitivity, response and signal to noise ratio such that it can be used for airborne imaging, especially in a military reconnaissance application. Further improvements are directed to an IR focal plane exposed to incident radiation that is coupled to a CMOS imager to thereby provide for improved performance for incident scene radiation in the infrared portion of the spectrum.

The performance requirements for aircraft based Visible and Near Infra-Red (Vis and NIR) wavelength imaging systems mandate that solid state Vis/NIR focal plane technology enable unique capabilities unlike most commercial or consumer applications of imaging technology. Historically, CCD image sensor technology has provided the needed critical performance and configuration demanded by airborne imaging applications. However, as airborne reconnaissance systems begin to incorporate additional functionality and interoperability through reductions in size, weight, power, and cost, it is becoming increasingly difficult for CCD technology to support these objectives, due to limitations in the fundamental fabrication and operational principles of the CCD image sensor itself. Although present CMOS image sensor technology does not support the broad, demanding performance requirements currently provided by the CCD, the successful evolution of airborne reconnaissance imaging systems will rely on the adaptation of CMOS image sensor technology to enable the improvements necessary to advance the art. The CMOS imager design aspects disclosed herein enable this result to be achieved.

In order to achieve both the stringent and contradictory performance requirements of the airborne reconnaissance grade Vis/NIR image sensor in a CMOS technology, customization of both the CMOS process and the pixel design technologies is required. To further understand the problem, it will be noted that optimum sensor performance requirements include seemingly contradictory aspects. On the one hand, each pixel in the focal plane must have a large full well electron capacity for shot noise (thermal) limited high background, large signal performance, as would be expected during the daytime with full scene illumination. However, on the other hand, each pixel must have high sensitivity and low noise for small signal extraction, in order to provide for reconnaissance capability in low light level situations, such as when shadows are present in the field of view. Therefore, aspects of the present invention provide for a novel, modified pixel design to satisfy this dynamic range dilemma.

Furthermore, present CMOS imaging technologies are optimized for photoresponse in the visible band from 450 nm to 700 nm, with the desired NIR response filtered or dramatically reduced. Customization of the CMOS process is therefore also needed to further extend the sensor response from 700 nm to 950 nm for airborne reconnaissance applications.

The embodiments of disclosed herein are intended to solve the contradictory dynamic range dilemma of the airborne CMOS image sensor by providing a pixel design, which achieves large well fill performance as well as high sensitivity and a high signal to noise ratio (SNR) while preserving linearity of response.

It is known in the art that CMOS active pixel sensors rely on each pixel having a charge to voltage conversion amplifier to create local voltages representative of the signal value illumination recorded at the pixel. A representative prior art CMOS pixel 10 is shown in FIG. 1A. Incident radiation 12 impinges on a photodetector 14. Collected charge is supplied to an amplifier 16. A gate 18 is clocked to direct a voltage signal on the output of the amplifier to an output multiplexer (not shown) along conductor 24. A reset gate 20 resets a transistor 22 at the output of the photodetector 14 as shown.

The typical prior art (FIG. 1A) teaches that a CMOS APS pixel contains one detector 14 and one amplifier circuit 16 per pixel. The performance of the pixel is determined by the detection, amplification, and noise performance of the single detector, single amplifier combination. Typically, most imaging applications will either fall in the category of still or video photography, or controlled light source photography. Prior art pixel design has not previously been required to provide both high sensitivity and signal to noise ratio for small signals while simultaneously providing good contrast signal to noise for small signals buried within high background illumination scenes.

FIG. 2 is an illustration of a CMOS image sensor 30 having an array 32 of CMOS pixel sensors 10, one of which is shown enlarged. The array 32 is arranged in rows and columns of pixels, perhaps 25 or 50 million in all. FIG. 2 shows a column amplifier 36 which amplifies the output voltage from the pixel sensors 10. The amplified signals are supplied to a multiplexer 34. The multiplexed output signals are amplified by an amplifier 38. The amplified signal is supplied to A/D converters and signal processing circuitry which is conventional.

FIG. 3 is an illustration of a four transistor prior art CMOS Active Pixel sensor. This design includes a global shutter transistor 40, reset transistor 22, amplifier transistor 16 and select transistor 18. By controlling the biasing of the shutter transistor 40, the accumulated charge on the photodiode detector 14 is selectively applied to the charge to voltage conversion amplifier transistor 16.

FIG. 4 is another prior art four transistor CMOS pixel design. It includes a transfer transistor 42, a reset transistor 44, charge to voltage conversion amplifier 16 and a select transistor 18 transferring the voltage signal from the output of the amplifier 16 to the conductor 24. The transfer gate transistor 42 acts in a similar fashion to the shutter transistor 40 of FIG. 3.

Prior art pixel design has addressed the extension of CMOS pixel dynamic range to accommodate large background signals by compressing the response to large signals with non-linear amplification or by subtracting signal values through down stream signal processing. The compressed response to large signals degrades the contrast signal to noise ratio for the airborne reconnaissance imaging application by reducing the contrast between the small signals present in the large background signal and the background signal itself. The associated graph shown in FIG. 1B illustrates the compromised signal handling capacity and the non linearity of the response as the illumination increases and is compressed. For example, in region 26, there is very little increase in the output signal on conductor 24 as illumination increases.

Various other methods have been employed to compress the input dynamic range including the utilization of variable detector voltage values, multiple storage of lines of signal integrated with different integration times then subtracted, logarithmic response amplifiers, anti-blooming structures to limit collected signal charge, pixel level analog to digital conversion (ADC) and gain adjustment, as well as other concepts.

Typically, the response of a visible detector is linear with respect to optical signal input to the point of either pixel well saturation or full signal swing of the detector sense node. Beyond the saturation illumination level, the response curve becomes essentially flat. See FIG. 1B. The prior art methods to extend detector dynamic range do not preserve the linear response of the detector while maintaining signal integrity for both high and low scene illumination levels.

The full well capacity of a CCD image sensor pixel is generally limited by the charge handling capacity of a gated potential well that usually has an antiblooming feature to avoid signal charge from mixing with adjacent pixels when a pixel that has reached its well saturation limit. Conversely, the saturation limit of a CMOS image sensor is typically more a complex function of the floating diffusion sense node voltage swing, photodiode storage capacity, and additional capacitances added to the pixel amplifier circuit. The critical relationship for the saturation value of a CMOS sensor pixel is $CV=Q$, where V=the useful linear voltage swing allowed at the detector sense node (reset node typically), C=the capacitance of the sense node (amplifier 16 input node) (including all parasitics), and Q=all photogenerated and thermally generated signal electrons collected and incident on the sense node.

The voltage limit at the sense node is determined by the supply voltage and the threshold of the reset transistor 22 of FIG. 1A. The largest voltage swing at the sense node for an N-channel transistor is Vdd-Vt. The practical reality is that the sense node is typically coupled to the gate of a source follower circuit, which has a range of useful input voltages for operation. Typically, the maximum useful voltage swing at the sense node of a CMOS image sensor is <60% of Vdd.

In general, the P/N junction diode photodetectors have a much higher limit for charge storage capacity than the voltage swing at the sense node will allow. The photodiode typically begins to forward bias when over-illuminated such that excess charge is swept into the substrate, thus creating a built-in antiblooming circuit.

The relationship that describes the conversion of signal charge to useful voltage signal is determined by the sense node capacitance or qe/Cnode (microvolts per electron). As the node capacitance increases, the charge to voltage gain decreases, but the dynamic range of the allowable input signal increases as Vmax is reached more slowly.

Increasing the node capacitance is the simple method for increasing the saturation charge limit for the CMOS sensor pixel. Increasing the maximum voltage swing in the sense node is another method. Unfortunately, the maximum voltage swing is limited by the maximum allowable Vdd voltage for the CMOS process design rules being used. Smaller dimension design rules dictate smaller voltages. For circuits that require small geometries for packing density and/or low voltages for low power operation, the maximum Vdd supply value scales to ever-lower values.

The effect of increasing the capacitance at the sense node is to decrease the signal to noise ratio by $1/\sqrt{C}$. Hence, for small signals, it is desirable to minimize the sense node capacitance. However, in the airborne imaging and reconnaissance application, it is also necessary to have a large charge handling capacity to improve shot noise limited signal to noise ratio (varies as Vsignal/√Vsignal) for scenes with high background signal and low contrast between target features and the background signal. For the case of optimized small signal gain, adding gain (g) to the sense amplifier while decreasing the sense node capacitance results in an increase in the signal to noise ratio proportional to $\sqrt{g}/\sqrt{C}$ (in simplistic terms).

A critical requirement for airborne reconnaissance imaging systems is to have high signal to noise ratios, for both small signal and high background signal imaging conditions. As previously stated, this creates a conflict for conventional pixel design. Small node capacitance favors better small signal SNR, while large node capacitance favors better SNR for large signals. The present invention describes methods for achieving both SNR goals by utilizing novel CMOS image sensor pixel designs.

Prior art of interest includes the paper *Large Area TDI Image Sensor for Low Light Level Imaging*, M. Farrier and R. Dyck, IEEE Transactions on Electron Devices, Vol. ED-27, No. 8 (August 1980), and U.S. Pat. Nos. 6,486,504; 6,011,251; 6,757,018; 6,734,905; and 6,710,804. See also *Wide Intrascene Dynamic Range CMOS APS Using Dual Sampling*, O. Y. Pecht, et al., IEEE Transactions on Electron Devices, Vol. 44, No. 10 (October 1997). Other prior of interest include U.S. Pat. Nos. 5,128,534 and 6,593,562 and the publication "Focal Plane Arrays and CMOS Readout Techniques for Infrared Imaging Systems", IEEE Transactions on Circuits and Systems for Video Technology, 1997.

SUMMARY OF THE INVENTION

In a first aspect, a hybrid imaging array is described comprising an array of infrared detector elements coupled to a CMOS readout integrated circuit having an array of pixels arranged in a plurality of rows and columns. Each infrared detector element in the array of infrared detector elements is electrically coupled to a corresponding pixel in the array of CMOS pixel elements in the readout circuit. Each of the CMOS readout pixels comprises:

a) a detector input node for receiving a signal from the IR detector element and generating a signal output;

b) a first relatively lower gain, wide dynamic range amplifier circuit coupled to the detector input node, the first circuit optimized for a linear response to high light level input signals;

c) a second relatively higher gain, lower dynamic range amplifier circuit coupled to the detector input node, the second circuit optimized to provide a high signal to noise ratio for low light level input signals;

d) a first output select circuit for directing the output of the first amplifier circuit to a first output multiplexer; and e) a second output select circuit for directing the output of the second amplifier circuit to a second output multiplexer;

wherein separate outputs of the first and second circuits are provided for each of the individual pixels of the CMOS readout integrated circuit.

In a further aspect, a method of imaging a scene with a hybrid imaging array comprising an array of IR detectors and a CMOS readout integrated circuit having an array of pixels is described. Each IR detector element is electrically coupled to a corresponding pixel in the CMOS readout integrated circuit, where the pixels are arranged in a plurality of rows and columns. The method comprises performing the following steps in each pixel:

a) directing scene illumination onto an IR detector in the array of IR detectors;

b) supplying a signal from the IR detector to a detector input node;

c) supplying charge from the detector input node through a first transfer gate to a relatively low gain, wide dynamic range amplifier circuit and generating a first output;

d) supplying charge from the detector input node through a second transfer gate to a relatively high gain, limited dynamic range amplifier circuit and generating a second output signal; and e) clocking a first output select gate and a second output select gate so as to separately transfer the first output signal of said first circuit and the second output of the second circuit to a first output multiplexer and a second output multiplexer, respectively.

In another aspect, a hybrid imaging array is described comprising an array of infrared detector elements electrically coupled to a CMOS readout integrated circuit arranged in a plurality of rows and columns of pixels, wherein there are two infrared detector elements electrically coupled to each one of the CMOS pixels. Each of the pixels comprises:

a) a first detector input node for receiving a signal from a first one of the two IR detector elements;

b) a first relatively lower gain, wide dynamic range amplifier circuit responsive to signal received at the first detector input node, the first circuit optimized for a linear response to high light level input signals;

c) a second detector input node for receiving a signal from a second one of the two IR detector elements;

d) a second relatively higher gain, lower dynamic range amplifier circuit responsive to signal received at the second detector input node, the second circuit optimized to provide a high signal to noise ratio for low light level input signals;

e) a first output select circuit for selectively directing the output of the first circuit to a first output multiplexer provided for the imaging array;

f) a second output select circuit for selectively directing the output of the second circuit to a second output multiplexer provided for the imaging array;

wherein separate outputs of the first and second circuits are provided for each of the individual pixels of the imaging array.

In still another embodiment, a method of imaging a scene with a hybrid imaging array comprising an array of IR detectors and a CMOS readout integrated circuit, the hybrid imaging array configured as a plurality of pixels arranged in rows and columns, comprising performing the following steps in each pixel:

a) directing scene illumination onto at least a first IR detector and a second IR detector;

b) supplying charge received from the first IR detector through a first transfer gate to a relatively low gain, wide dynamic range amplifier circuit coupled to the first photodetector and generating a first output;

c) supplying charge from the second IR detector through a second transfer gate to a relatively high gain, limited dynamic range amplifier circuit coupled to the second photodetector and generating a second output signal; and d) clocking a first output select gate and a second output select gate so as to separately transfer the first output signal of said first circuit and the second output signal of the second circuit to a first output multiplexer and a second output multiplexer, respectively.

BRIEF DESCRIPTION OF THE DRAWINGS

Presently preferred embodiments of the invention will be discussed below in conjunction with the appended drawing figures, wherein like reference numerals refer to like elements in the various views, and wherein:

FIG. 11 also shows the typical prior art CMOS pixel response, e.g., for the pixels of FIGS. 1-4.

FIG. 12A is a cross section of a CMOS pixel in accordance with FIG. 5A with a front side illumination.

FIG. 12B is a top plan view of the CMOS pixel layout for the design of FIG. 12A. Note the relatively large pixel area needed for an acceptable fill factor.

FIG. 13 is a cross-section of a CMOS pixel with backside illumination in accordance with an alternative embodiment of the invention.

FIG. 14 shows a CMOS pixel layout with a relatively small pixel area and fill factor, which is a situation that is preferably avoided for most aerial reconnaissance applications for CMOS imagers. FIG. 14 is a top view of a front-side illuminated pixel with a high gate count using the design rule of FIG. 13 and a smaller pixel pitch.

DETAILED DESCRIPTION OF REPRESENTATIVE PREFERRED AND ALTERNATIVE EMBODIMENTS

Before describing hybrid infrared detector array embodiments, a description is set forth of presently preferred CMOS imaging arrays which are suitable for the CMOS dual amplifier readout integrated circuit portion of a hybrid detector array. The inventive methods and devices are applicable to other CMOS imaging array designs and the following descriptions are offered by way of illustration and not limitation. A disclosure of methods for detecting moving objects in a scene is also provided which can be used with the hybrid infrared detector array.

Figure 5A:
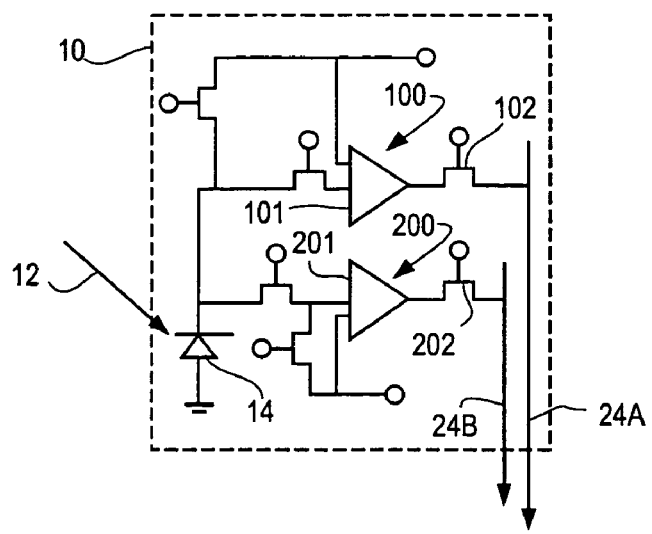
FIG. 5A is an illustration of a single photodiode and two charge to voltage conversion circuits within a CMOS pixel. One circuit is optimized for large signal operation while the other circuit is optimized for small signal operation.
Figure 6:
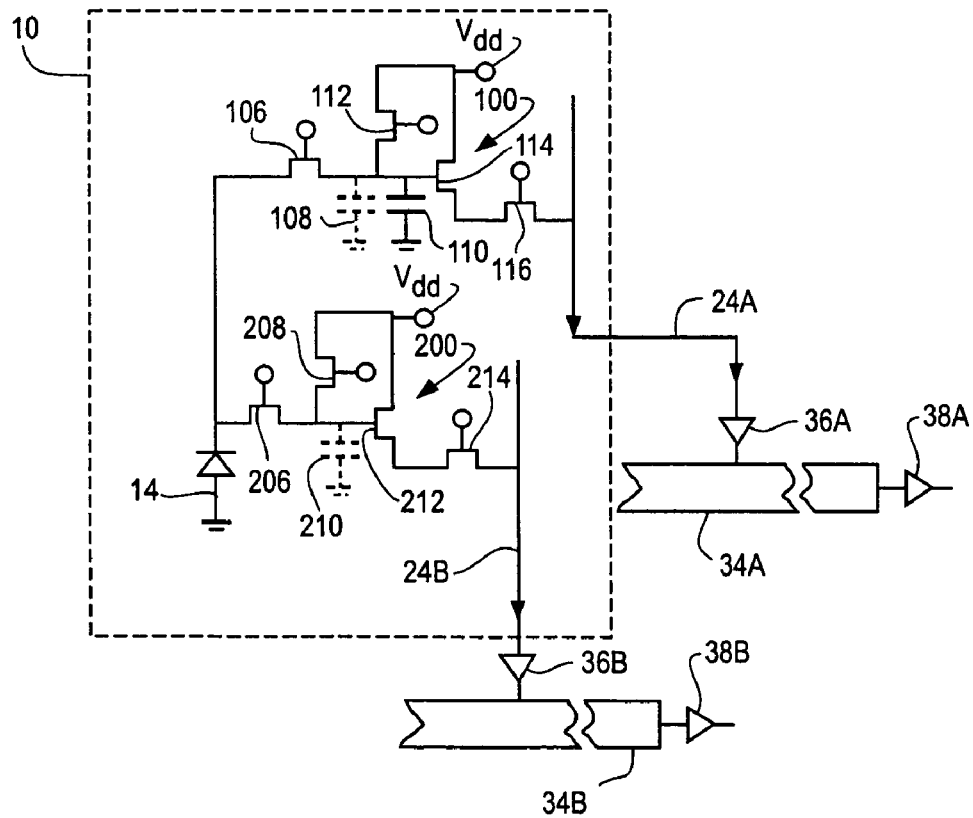
FIG. 6 is an illustration of a CMOS active pixel sensor in accordance with another embodiment. This embodiment includes a single photodiode detector coupled to two transfer gates and two charge to voltage amplifier circuits in parallel. As in the case of FIG. 5A, one circuit is optimized for large signal operation while the other circuit is optimized for small signal operation.

An improved CMOS imaging array is described below comprising a plurality of individual pixels arranged in an array of rows and columns of individual pixels. The number of pixels can vary, but embodiments of 25 and 50 million pixels are considered exemplary. Each pixel in the plurality of individual pixel sensors is preferably the same. A representative example of the CMOS pixel sensor 10 is shown in FIG. 5A. In this embodiment, the pixel sensor includes the following elements:

a) A photodetector 14 receiving incident light 12 and generating an output (accumulated charge).

b) A first relatively lower gain, wide dynamic range amplifier circuit 100 responsive to the output of the photodetector 14, the first circuit 100 optimized for a linear response to high light level input signals. The amplifier circuit 100 may also function as a charge to voltage conversion circuit.

c) A second relatively higher gain, lower dynamic range amplifier circuit 200 responsive to the output of the photodetector 14, the second circuit 200 optimized to provide a high signal to noise ratio for low light level input signals. The second circuit may also function as a charge to voltage conversion circuit.

d) A first output select circuit 102 comprising, in the preferred embodiment a transistor gate for selectively directing the output of the first circuit to a first output multiplexer (not shown in FIG. 5A, see 34B in FIG. 6).

e) A second output select circuit 202 comprising a transistor gate for selectively directing the output of the second circuit to a second output multiplexer (not shown in FIG. 5A, see 34A in FIG. 6).

Separate voltage signal outputs of the first and second circuits 100, 200, respectively are provided for each of the individual pixel sensors of the CMOS imaging array. In particular, the voltage output from the first circuit is optimized for high light level conditions with wide dynamic range, and the voltage output from the second circuit is high gain, optimized for low light level condition, with less dynamic range but with high signal to noise ratio.

The CMOS active pixel sensor is designed with CMOS processing technology for enhanced dynamic range and signal integrity by utilizing two distinct detection processes and two charge to voltage conversion amplifier circuits 100, 200 within the unit cell of each CMOS pixel 10. The detector 14 is combined with two amplifiers 101, 201 to supply two separate voltage outputs on conductors 24A, 24B from each pixel. In an alternate embodiment (see FIG. 9), two detectors are combined with the two amplifiers. In either case, the two output signals can be read out simultaneously, line sequentially, or frame sequentially. The use of two outputs from the first and second circuits provides for optimal signal conditioning and performance for both high level and low level optical input signals that are incident on the CMOS image sensor within the same imaging frame and within the same integration or exposure period. One amplifier output voltage (amplifier 201) is optimized for best signal to noise ratio for low light level input signals. The second output amplifier voltage (amplifier 101) is optimized to provide a linear response to large light level input signals, such that the signal to noise ratio for small signals of interest residing in an area of large background scene illumination will be improved by shot noise limited imaging principles. The disclosed array solves the problem of providing both extended linear dynamic range for enhanced contrast signal to noise and high sensitivity for low light level content in the image.

Figure 5B:
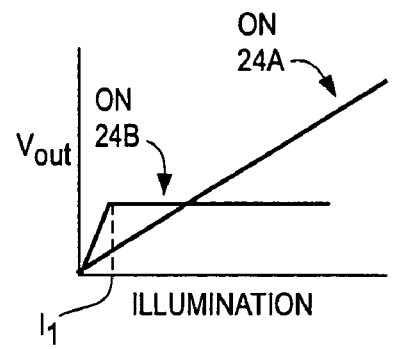
FIG. 5B is a graph of the output signal response from the two charge to voltage conversion circuits as a function of scene illumination.

The graph shown in FIG. 5B illustrates the improvement provided by the disclosed array where the image sensor signal performance is optimized for both large and small signals without degradation to linearity or SNR. Also note the well capacity for the pixel of the present invention is superior to the prior art since the node capacitance can also be optimized. In particular, the output of the first circuit 100 on conductor 24A of FIG. 5A produces a linear response at high illumination levels as shown in FIG. 5B. However, the output of the second circuit 200 on conductor 24B shows a high signal response at low illumination levels. While this response becomes non-linear and flat at illumination level $I_1$, this is of no great concern since the signal output from the first circuit can be selected to produce a linear response at this and higher levels of illumination.

The preferred embodiments provide for charge detection, charge transfer, and charge conversion structures within each pixel sensor of the CMOS imaging array. There are several motivations for creating these various embodiments due to pixel area constraints, noise performance optimization, sensor yield, pixel fill factor, as well as other considerations. As an example of an alternate pixel technology, a pinned photodiode or PPD detector technology can be applied to replace the p/n junction photodiode technology of the preferred embodiment.

An alternative embodiment is described in the circuit diagram of FIG. 6. The circuit consists of a reverse biased photodiode 14 detecting optical radiation in the visible and near infrared spectra, and two charge to voltage amplifier circuits, 100 and 200. The first amplifier circuit 100 consists of a transfer gate 106, Capacitance Node (Cnode) 108, capacitor 110, reset transistor 112, source follower transistor 114 and output selection gate 116. The second amplifier circuit 200 consists of a transfer gate 206, reset gate 208, Cnode 2 (210), source follower transistor 212 and output selection gate 214. The amplifier circuit 100 is designed to optimize signal to noise performance for large signals. The amplifier circuit 200 is optimized for small signals and low light level conditions. The optimization is achieved, in part, by adjusting the capacitances at Cnode 1(108), capacitor 110, and Cnode 2 (210). Transfer gates 106 and 206 are positioned between the photodiode detector 14 and the two resettable floating diffusion capacitors Cnode 1(108) and Cnode 2 (210) and serve to isolate each amplifier 114 and 212 from the photodiode 14. Each of the floating diffusion nodes is reset to the voltage Vdd by a separate reset transistor 112, 208. Cnode 1 is reset by transistor reset 112 and Cnode 2 is reset by transistor reset 208. The total capacitance on each of the floating diffusion nodes Cnode 1 and Cnode 2 consists of photodiode to substrate capacitance, gate overlap capacitance, and parasitic capacitances from the process layers used to construct the interconnection layers. In some cases, additional capacitance may be added to the floating node Cnode 1 through additional circuit elements such as poly to poly capacitors, as indicated by capacitor 110 in circuit 100.

In this embodiment, the capacitances at the floating diffusion sense nodes of the two circuit paths Cnode 1 (108) and Cnode 2 (210) are designed to be different values. Cnode 1, for example, could be approximately equal to the capacitance of the photodiode detector 14 and therefore capable of accommodating the signal charge associated with the largest signal integrated at the photodiode detector. Extra capacitor 110 is optional. The second capacitance Cnode 2 (210), in contrast, is then made substantially smaller in value than Cnode 1 or that of the photodiode detector 14, and therefore could provide larger charge to voltage conversion gain than that of the circuit 100. The larger charge to conversion gain and small capacitance provided by Cnode 2 (210) provide optimized small signal response and high signal to noise ratio (SNR). The source-follower amplifier transistors 114 and 212 are designed with differing physical layouts (W/L ratios) to optimize the signal to noise performance for each circuit's performance objective. Cnode 1 (108) and Cnode 2 (210) are shown in dashed lines in FIG. 6 to indicate that they may represent inherent capacitance of the sensor substrate, gate overlap capacitance, and parasitic capacitance and need not consist of an additional physical capacitor.

Each of the two amplifier circuits 100 and 200 has a separate source follower output transistor 114 and 212 and associated gate transistor 116 and 214 for selecting the output of either amplifier 114 or 212. Source follower amplifier 114 is selected by selector gate transistor 116 which then drives external column amplifier 36A for readout by the external output multiplexer 34A. Source follower amplifier 212 is selected by selector gate transistor 214 which then drives external column amplifier 36B for readout by external multiplexer 34B. In this embodiment, separate column lines 24A and 24 B are utilized and are separately selected corresponding to the amplifier output signal of choice. Each column output is directed to a separate column amplifier 36A, 36B then to a separate multiplexing circuit (34A, 38A) (34B, 38B) as shown in FIG. 6. Each column amplifier 36A, 36B design is optimized for signal to noise performance for each of the two signals generated. Those skilled in the art may also recognize that the two signals could be combined, using another multiplexing switch, into a single output multiplexer circuit to simplify the design.

The operation of each amplifier circuit 100 and 200 in the embodiment shown in FIG. 6 is as follows. The amplifier sense node voltages are reset through the reset transistors 112 and 208. Integration of signal charge occurs at the photodiode 14 when optical signal (illumination) is present. The photodiode signal charge is transferred to the sense node (Cnode) 1 (108) and/or Cnode 2 (210) through transfer gates 106 and/or 206. Charge is converted to voltage at the source follower transistors 114 and 212. The signal voltage is scanned by random access scan clocks such that a line sequential parallel/serial readout of the image frame is achieved by the operation of the output select circuits (select gates 116 and 214, associated output conductors 24A and 24B) and the column amplifiers 36A and 36B and multiplexers 34A and 34B.

The integration cycles for each of the two circuits 100 and 200 may be set for the same duration but staggered by one integration time, or alternatively, set for different integration times staggered by either the shorter or longer integration time. This operation would be dependent on the system clocking and influenced by scene illumination and feedback from the down stream signal processing. If the integration and readout times of the images from the two circuits 100 and 200 are separated, it is possible to obtain useful information regarding image motion within the imaged scene. This is discussed in more detail later on. The transfer gates 106 and 206 would not be turned on simultaneously, but would be alternating during the composite integration time. The user would have the option of integrating and transferring signal through the output multiplexers in any of three modes: 1) Simultaneously, 2) Line interlace mode, or 3) Alternate frame mode.

The simultaneous readout mode affords the user the ability to extract both large signal and small signal information from the image scene within the shortest time interval between integration periods; image motion effects between the two scene samples would be minimized. Another technique is line sequential, meaning that a line of data from amplifier 1 is read out through the multiplexer followed by a line of data from amplifier 2, and alternating in that way throughout the frame of imagery. Another alternative is frame sequential, meaning that data is read out from amplifier 1 only during a first frame, and then data is read out from amplifier 2 during a second frame. Image data could be from the same integration time, or it could be from different integration times. Using either the line sequential or frame sequential methods would require faster readout multiplexers to maintain higher frame rates. In particular, if two multiplexers are running simultaneously at rate F, as in the preferred embodiment, one frame of data can be read out in time X. If the output multiplexers are operated singly at rate F, the frame of data requires 2X time to read out. Alternately, if the multiplexers are clocked at a rate 2F, the total time to read out a frame of data from two multiplexers alternately is X, just as in the case of reading the two multiplexers simultaneously.

Combinations of the two output frames could be selected such that both small signal performance in low light level portions of the scene and low contrast high signal performance can be optimized within the same scene, taken in a snapshot or global shutter mode. An additional benefit to combining or comparing two frames integrated at nearly the same time or within a precisely measured time period is that objects moving at a rate that is discernable within relatively short integration times may be accurately measured such that the velocity of the object may be precisely determined. This feature will be described in further detail below.

Figure 1A:
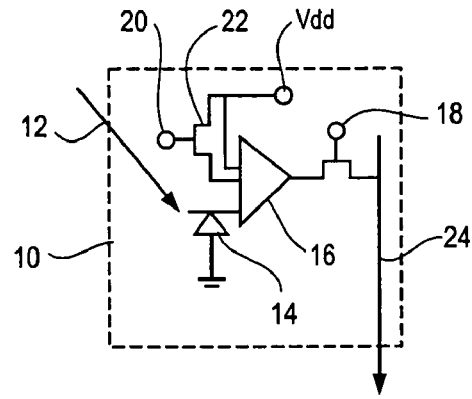
FIG. 1A illustrates a typical prior art 3 transistor CMOS APS pixel design using a single photodiode and a single output amplifier.
Figure 1B:
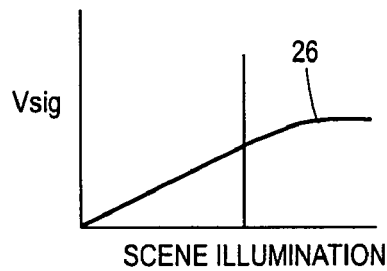
FIG. 1B shows the response of the circuit of FIG. 1A as a function of scene illumination.
Figure 2:
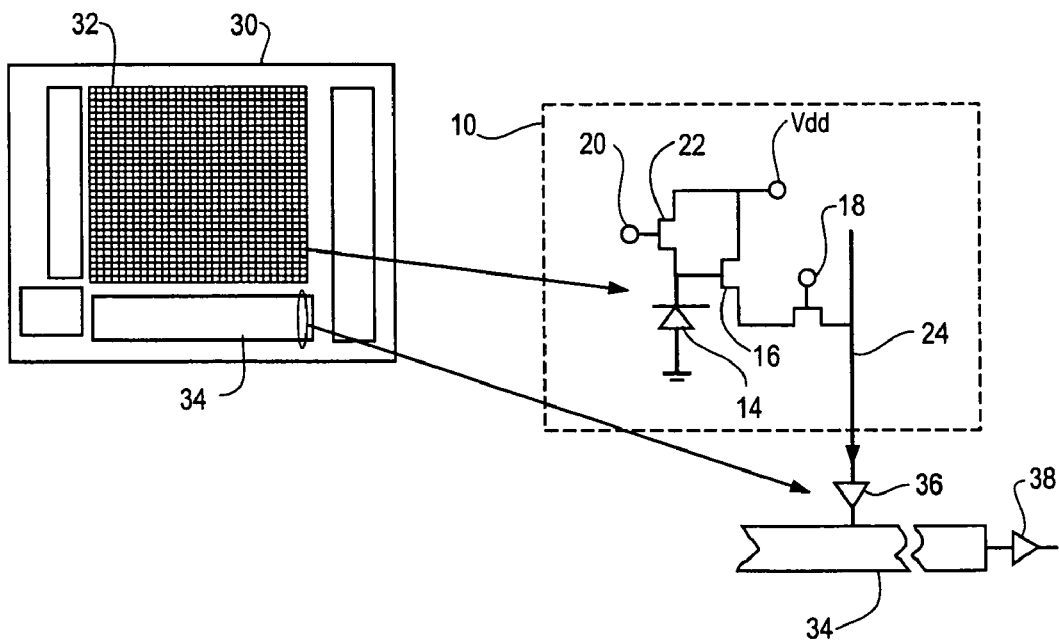
FIG. 2 depicts a typical CMOS APS sensor integrated circuit (IC) architecture with an exploded view of a pixel and the attendant column readout structure. The typical CMOS APS IC consists of several circuit blocks that control the clocks and biases applied to the pixels in the pixel array.
Figure 3:
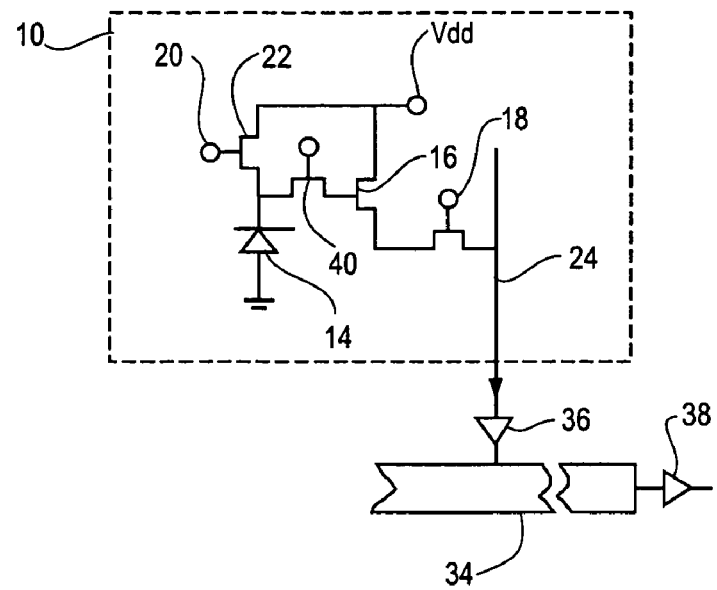
FIG. 3 is an illustration of a second common prior art CMOS pixel design that utilizes a transistor 40 for electronically controlling the exposure of all pixels simultaneously (globally).
Figure 4:
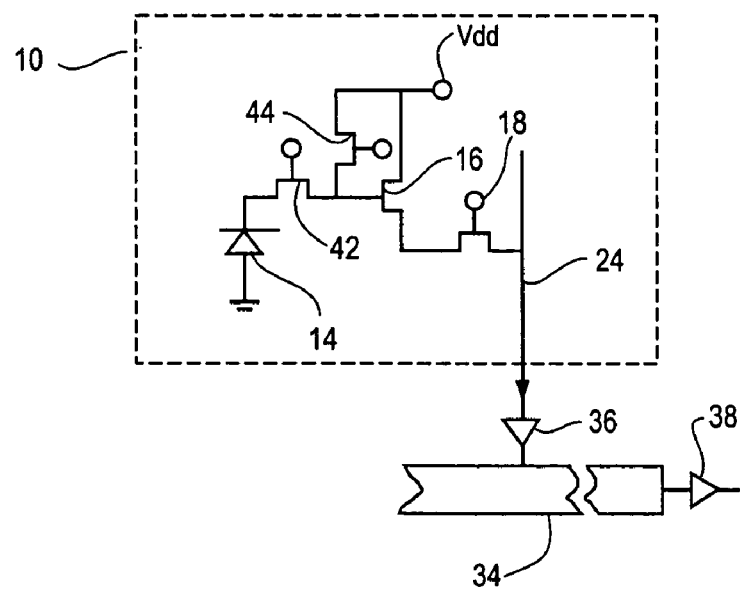
FIG. 4 is an illustration of a third prior art CMOS pixel design that includes a transfer gate 42 between the photodiode and the sense node of the charge to voltage amplifier 16. This transfer gate 42 is also used for electronically controlling the exposure of the pixels globally and for isolating the sense node from the photodetector.
Figure 7:
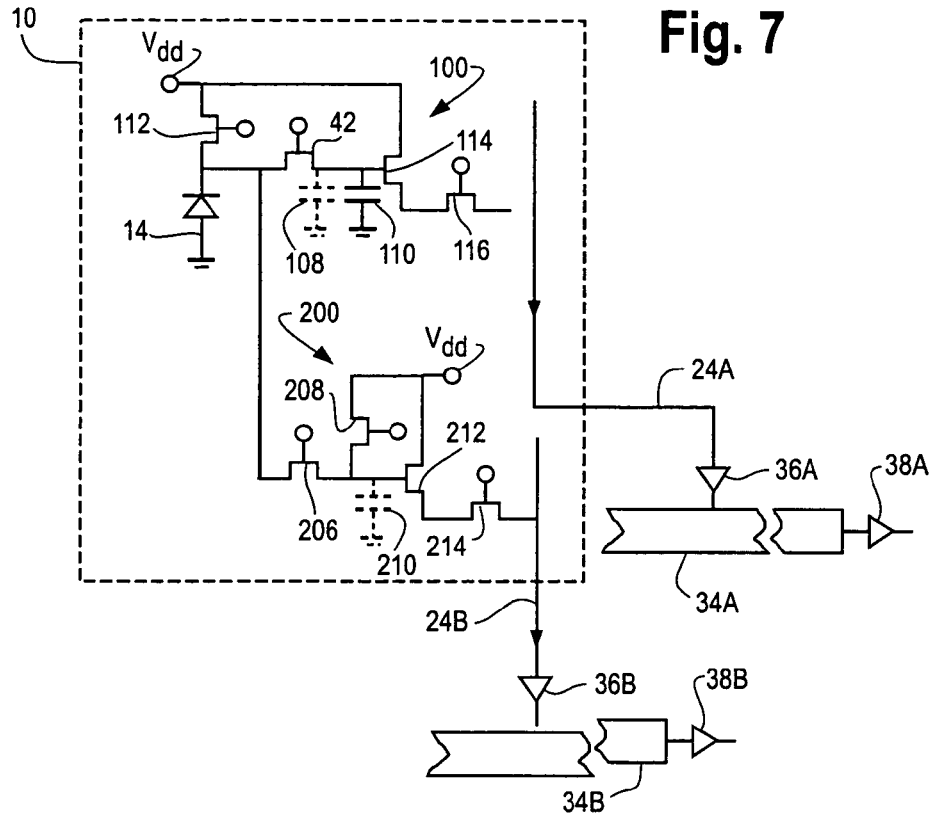
FIG. 7 is an illustration of a further embodiment. The new pixel design is again composed of two separated charge to voltage amplifier circuits with one circuit operating in the manner of FIG. 3 with a shutter gate, and the other circuit operating in the manner of FIG. 4 with a transfer gate for isolation.

FIG. 7 illustrates an alternative embodiment which is a variation of the embodiment depicted in FIG. 6. The embodiment of FIG. 7 combines an electronic shutter gate transistor 42 of the prior art shown in FIG. 4 into the large signal wide dynamic range amplifier circuit 100, while retaining the transfer gate shutter transistor 206 for the small signal amplifier circuit 200 as depicted in FIG. 6. The design architecture embodied in FIG. 7 enables the photodiode 14 and sense node capacitance to be combined (Cnode 1 (108) plus photodiode 14 capacitance Cpd). The advantage of this configuration is that it reduces the signal lag through the transfer gate 42 for the case where the photodetector is a p/n junction photodiode as opposed to a pinned photodiode. Extra sense node capacitor 110 is optional.

Figure 8:
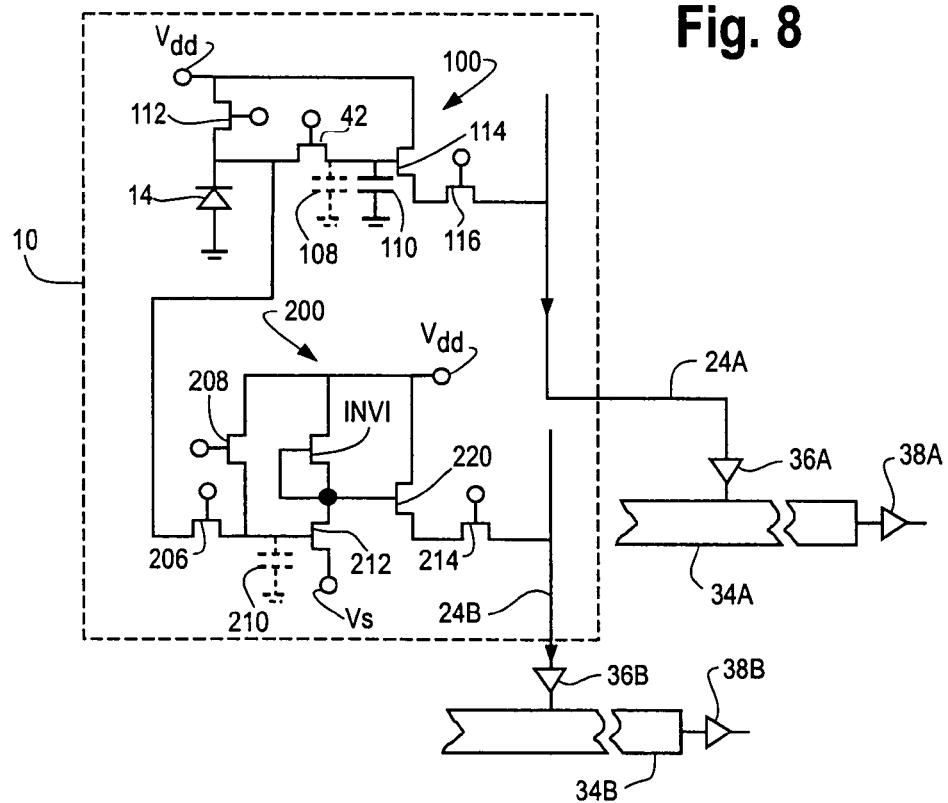
FIG. 8 is an illustration of a modification of the embodiment of FIG. 7, in which there is the addition of an NMOS inverter in the second amplifier circuit. The inverter stage is intended to provide additional small signal gain.

FIG. 8 shows the pixel 10 circuit design for a third embodiment. The circuit contains a first charge to voltage amplifier circuit 100 configured with the same elements as shown in FIG. 7 and functioning as a large signal, wide dynamic range amplifier utilizing the combined photodiode 14 capacitance Cpd and sense node, Cnode 1 (108) capacitances and optional capacitor 110 with shutter gate 42 between the source-follower transistor M1 (114) and the detector/sense node, Cnode 1, (108) and having output selector gate 116. However, the second charge to voltage amplifier circuit 200 has been reconfigured. Transfer gate 1 (206) remains connected to the photodiode 14 on one side and to reset gate 208, Cnode 2 (210) and transistor amplifier 212 on the other side; However, transistor 212 has now been configured with transistor INV1 to function as an inverting amplifier. Transistor 220 has been added as a source follower to isolate the inverting amplifier INV1 from output transfer gate 214 and subsequent column amplifier 36B. The inverter gain is controlled by the voltage Vs and the W/L layout ratios of INV1 and transistor 212 such that the voltage output signal gain is improved over the typical source-follower gain of $0.7<g<0.85$. However, it must be pointed out that the inverter performance characteristics can become non-linear at the extremes of the operating voltage range. Attention to the inverter design is necessary since this non-linearity can have a negative affect on fixed pattern noise correction and other signal processing applications.

For small input signals, the signal to noise ratio of the inverter gain amplifier circuit (212 and INV1) is improved by the ratio of $\sqrt{g}/\sqrt{Cnode\ 2}$ compared to a pixel circuit not optimized for small signal gain. Since the capacitance of the small signal amplifier circuit is low, the maximum allowed signal charge for that node is dictated by the CV=Q relationship, and is typically limited to 20% to 30% of the optimized signal capacity of the large signal wide dynamic range amplifier circuit, which can accommodate the full signal charge capacity of the detector photodiode.

Figure 9:
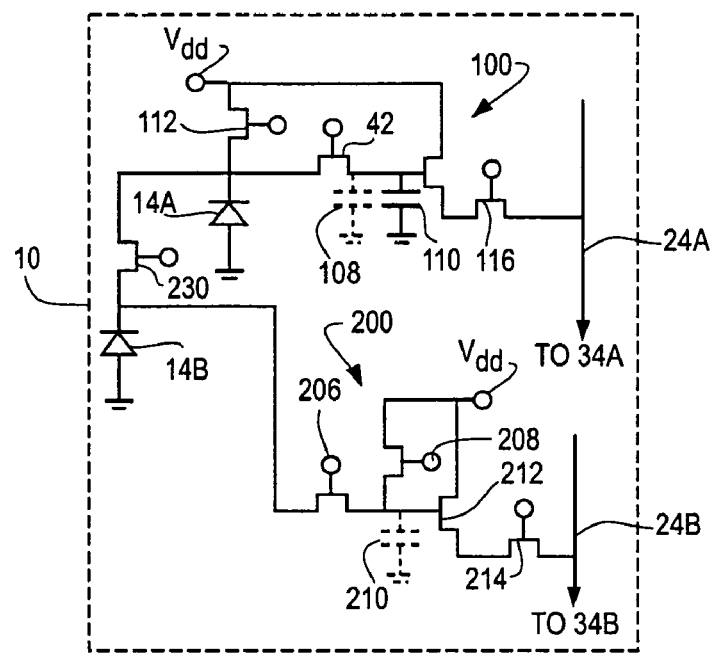
FIG. 9 is an illustration of an alternative embodiment to FIGS. 5-8, wherein two photodetectors (e.g., photodiodes) are used within each CMOS pixel such that one photodiode provides a signal to a first charge to voltage, amplifier circuit and the second photodiode provides signal to a second charge to voltage amplifier circuit.

Those skilled in the art will also recognize that it is possible to implement the pixel architecture of any of the embodiments shown in FIGS. 6, 7, and 8 using two separate photodiode detectors within the pixel sensor 10 such that each amplifier (114, 212) has its own photodetector. An example of a dual photodiode detector embodiment is shown in FIG. 9. Basically, in this embodiment, a CMOS imaging array is provided with a plurality of individual pixels 10. Each pixel in the plurality of individual pixels comprises a first photodetector 14A receiving incident light and generating an output and a first relatively lower gain, wide dynamic range charge to voltage amplifier circuit 100 responsive to the output charge of the first photodetector 14A, the first circuit 100 optimized for a linear response to high light level input signals. Each pixel 10 further includes a second photodetector 14B for receiving incident light and generating an output charge and a second relatively higher gain, lower dynamic range charge to voltage amplifier circuit 200 responsive to the output of the second photodetector, the second circuit 200 optimized to provide a high signal to noise ratio for low light level input signals. A first output circuit (116, 24A) is provided for directing the output of the first circuit 100 to a first output multiplexer 34A provided for the imaging array. A second output circuit (214, 24B) is provided for directing the output of the second circuit 200 to a second output multiplexer 34B provided for the imaging array. Accordingly, separate outputs of the first and second circuits are provided for each of the individual pixels in the imaging array. A mix gate 230 is shown in FIG. 9 which allows charge from photodiode 14B to be accumulated with the charge from photodiode 14A in the first circuit 100. The other elements as shown in FIG. 9 are as described previously in FIG. 7. The mix gate 230 allows the output of the two photodetectors to be combined to act as a single photodetector, with a combined detection area of the two individual photodetectors. The output of the combined photodetectors from the mix gate is supplied to both the first and second amplifier circuits.

Figure 10:
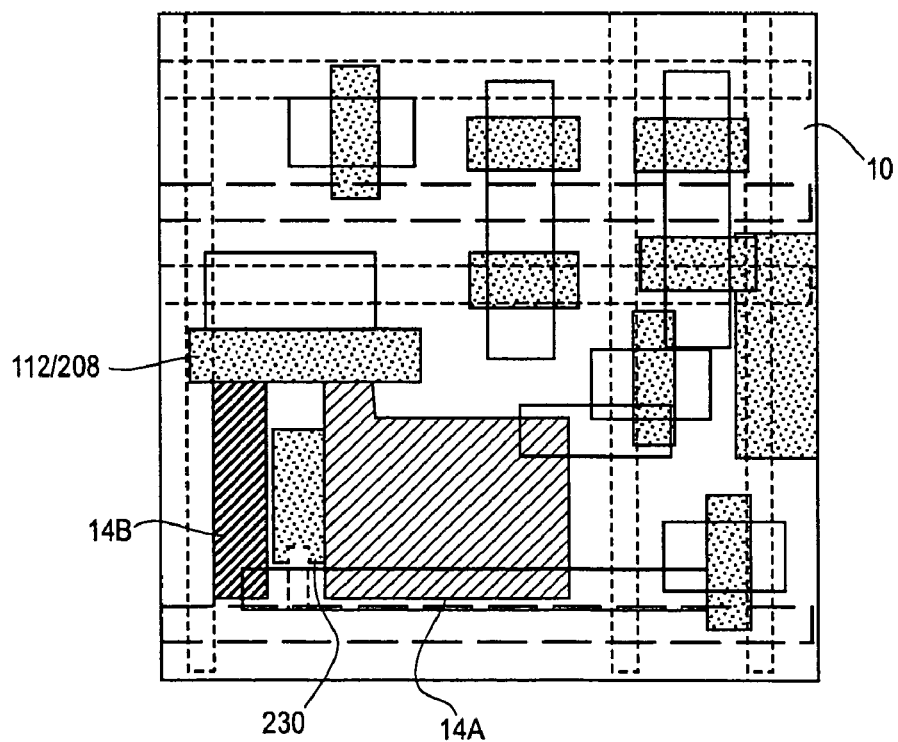
FIG. 10 is a plan view of the semiconductor layout for the embodiment of FIG. 9.

FIG. 10 is a layout view of a CMOS APS pixel 10 with drawn geometries that represent transistor gates, drains, sources, electrical interconnects, and photodiodes. The figure is representative of the masking features in a layout of a CMOS APS pixel with two photodiodes and two pixel amplifiers, but is not an actual pixel layout. Shown in the Figure is a possible configuration of two photodiode detectors, 14A and 14B, separated by a mix gate 230. Photodiode 14A is larger in area than photodiode 14B and the connect gate could be used to isolate the two photodetectors for separated integration and output functions or to combine the integrated signals from both of the photodiodes.

Figure 11:
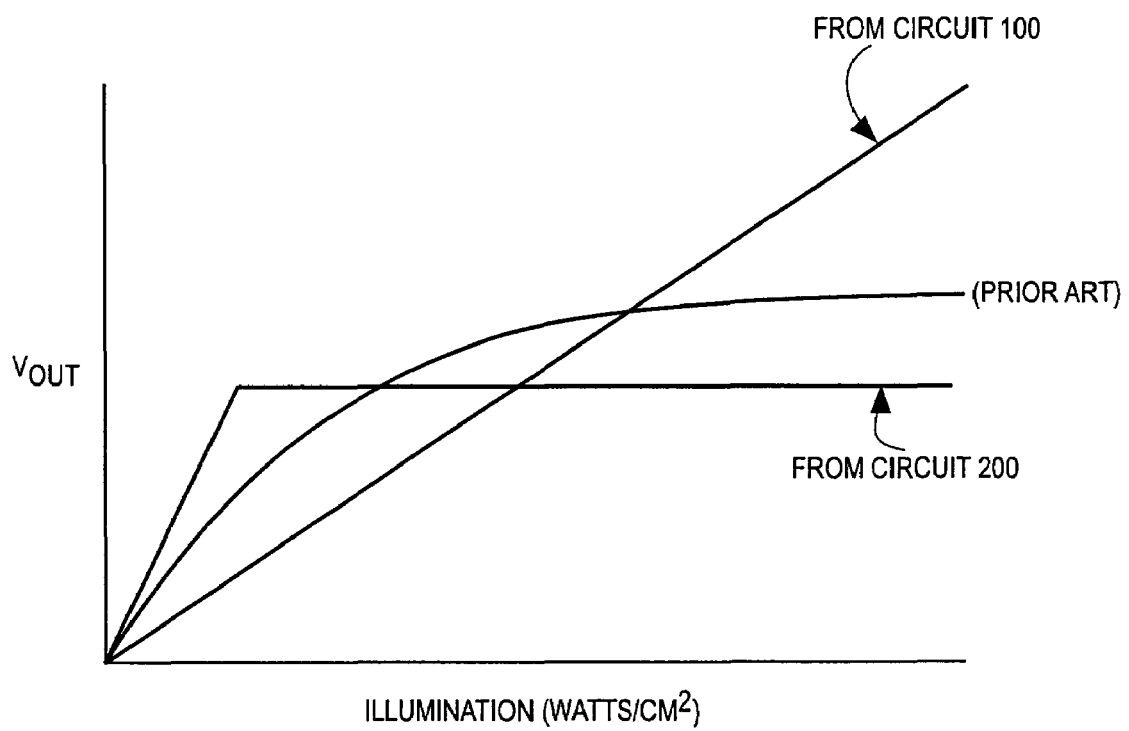
FIG. 11 illustrates the response of each of the two charge to voltage amplifier circuits within each CMOS pixel in accordance with the embodiments of FIGS. 5-9, showing both high signal to noise ratio and good signal response for low illumination from one circuit and a linear signal response for higher illumination scenarios from the other circuit.

FIG. 11 graphically depicts the relationship of the input optical illumination level incident on the photodiode detector and the analog voltage output seen at the output of the pixel charge to voltage conversion amplifier. The two lines labeled 100 and 200 represent the output characteristic of the two amplifier circuits 100 and 200 described above in the embodiments of the invention. Line 100 represents the response to input illumination that the amplifier with extended linear dynamic range generates while line 200 represents the response to input illumination that the high sensitivity amplifier circuit generates. The high sensitivity amplifier generates larger signals for small input illumination, while the wide dynamic range amplifier generates linear response to large signals. The prior art curve represents pixel and imaging system designs that incorporate circuits that extend the input dynamic range by creating a logarithmic or compressed response to large input illumination. In the prior art embodiments, small signals can be detected with relatively high sensitivity, however, large signal response is compressed such that the variation or contrast of signals in scenes of large illumination magnitude is reduced.

A disadvantage of using two photodiodes in a front-side illuminated CMOS pixel is that the pixel fill factor is reduced. The importance of fill factor is discussed below.

As shown in FIGS. 6 and 7, this embodiment requires that the pixel contain as many as eight (8) transistors, while the embodiment shown in FIG. 8 requires ten (10) transistors. It is desirable to use the minimum necessary number of transistors in a pixel so that the pixel may be compacted to the smallest pitch allowed by the CMOS process design rules and practical optics limitations. The photodiode detector generally requires a 50% to 60% unobstructed area within the pixel for optical input to be sufficiently absorbed. The efficiency or responsivity of the detector is critically dependent on the open photodiode area and is known in the industry as "fill factor". To maintain a constant acceptable fill factor for a CMOS image sensor while the gate or transistor count increases, generally requires the process design rule dimensions to decrease and the supply voltages to decrease, causing the process complexity to increase. If the process technology utilized does not support an increased gate count while maintaining an adequate fill factor, the pixel dimensions must increase to accommodate. For example, a 10 micron by 10 micron pixel, with four transistors (4T), designed using a minimum feature size of 0.35 microns will maintain a fill factor of approximately 50%. Using the same technology and pixel pitch but adding four more transistors (8T) would shrink the fill factor to less than 10%, which is unacceptable unless the sensor is constructed with very small design rules or as a backside illuminated image sensor. In the backside illuminated pixel case, the frontside fill factor is not a consideration since the fill factor of the photodiode aperture is nearly 100%. Therefore one further embodiment is to configure the CMOS image sensor with dual amplifier pixel circuitry as a backside illuminated detector array. See FIG. 13 and the discussion below.

For the case where the eight transistors are incorporated into a frontside illuminated CMOS array, either the CMOS technology design rule must shrink (to 0.18 micron or less) for the 10 micron pixel example, or the pixel size must grow to approximately 14 microns by 14 microns, to assure adequate fill factor. Hence, each embodiment of the present invention either requires advanced CMOS processing technology, backside illumination sensor technology, or pixel enlargement in order to be implemented.

FIG. 12A is a cross section of a CMOS pixel 10 showing the fill factor restriction for a front-side illumination indicated at 12. The illumination 12 impinges on the p/n junction photodiode detector 14 which is embedded in a p-Si substrate. Polysilicon transfer and reset gates, metal bus wires, and other circuit elements in the pixel sensor 10 are shown by rectangular boxes 300. The area bounded by the box 302 represents the area available for conversion of illumination to charge by the detector 14. The fill factor is about 30-40%.

FIG. 12B is a plan (layout) view of the pixel 10 of FIG. 12A. The pixel is frontside illuminated with a high gate count in accordance with a design rule "A". A larger pixel pitch (total pixel size) is needed to achieve an acceptable fill factor of 30-40%.

FIG. 13 is a cross section of a backside illuminated pixel 10 in accordance with one embodiment. This embodiment has an unrestricted fill factor—it is essentially 100% as indicated by the box 302. This design can tolerate a high gate count design with smaller pixel pitch using the design rule "A" of FIG. 12B.

FIG. 14 is a top view of a frontside illuminated pixel 10 with a high gate count using the design rule of FIG. 13 and a smaller pixel pitch. The smaller box 302 indicates the available area for scene illumination to impinge upon the photodiode detector 14. The fill factor (ratio of area bounded by box 302 to total area of pixel 10) is too small for most reconnaissance applications. Conversely, if back side illumination is incorporated into the design (as shown in FIG. 13), the fill factor is about 100%, as indicated by the larger box 304.

It is possible to utilize three or more different amplifier circuits and three or more separate output circuits, one per photodetector. Each photodetector and associated amplifier circuit could be optimized for a different signal level, spectral band, or other criteria. Furthermore, in a three-detector embodiment, each detector could be associated with a separate red, blue or green color filter and thereby provide separate red, blue and green output signals for incident radiation. The array could be backside illuminated with windows adjacent to the array which have color filters applied to the windows. Alternatively, the array could be front side illuminated with separate imaging areas for each of the three colors.

Figure 15A:
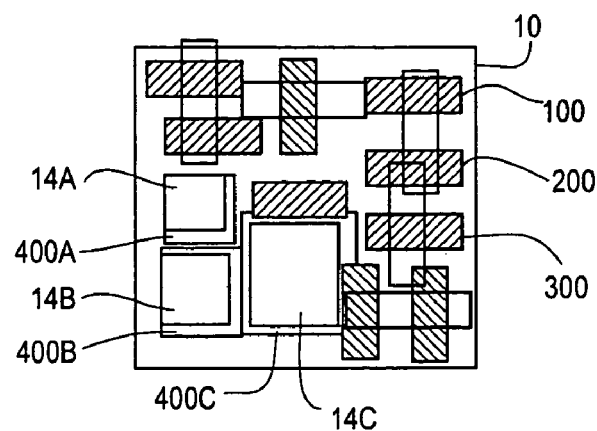
FIGS. 15A-C show several views of a color CMOS pixel sensor arrangement in accordance with yet another embodiment.
Figure 15B:
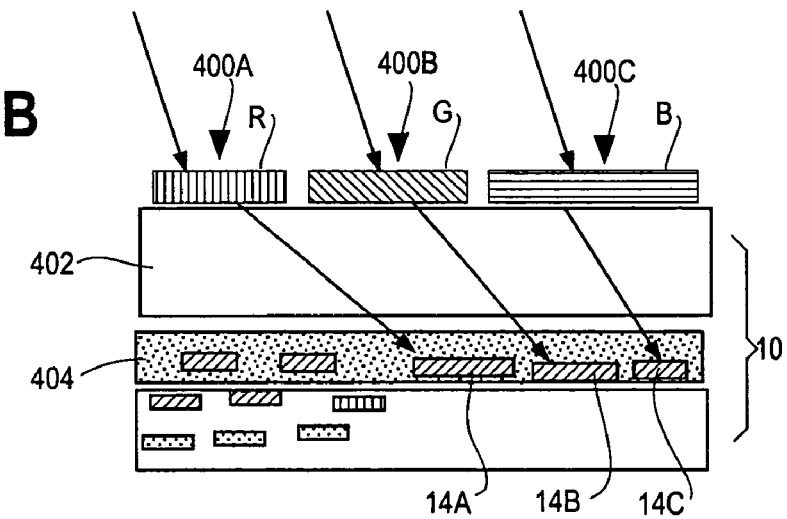
Figure 15C:
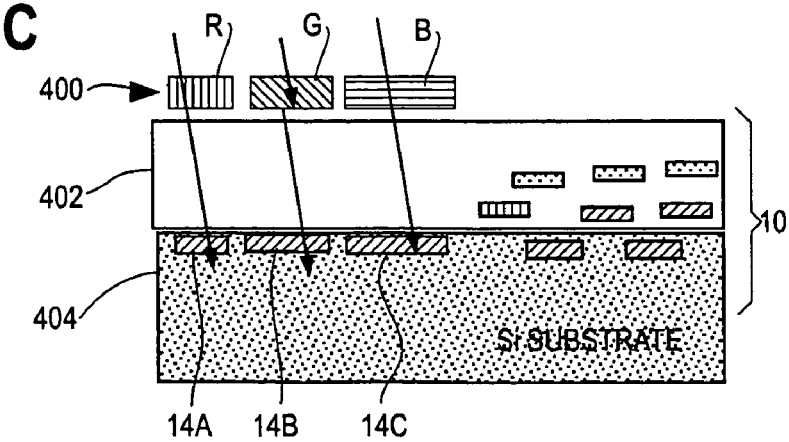

FIGS. 15A-C depict an alternative embodiment which could be employed using the invention to extract spectral information within a scene. Using multiple photodetectors, multiple pixel amplifiers, and a filter matrix such as filters 400A (e.g., red), 400B (e.g., green), 400C (e.g., blue), multiple wavelength bands or colors could be separately passed, such as red, green, and blue light (or near infra-red or other band) to the respective photodetectors 14A, 14B, 14C. Each pixel could simultaneously output multi-spectral scene data (such as red, blue and green scene data) that could be optimized for best signal to noise ratio. Because the photoresponse or quantum efficiency of the silicon photodetector is dependent on the wavelength of light (blue being weakest and red being strongest), the three detector/amplifier circuit combinations 100, 200, 300 within the pixel could be used to amplify the blue and green response to match that of the red response—thus normalizing the image sensor at the pixel level. Generally, this color normalizing function has to be done using downstream signal processing. Each detector/amplifier circuit combination output is transferred by its own output select circuit to a separate multiplexer, as is the case with the other embodiments. As shown in FIGS. 15B and 15C, the color filters 400 are mounted on top of a color filter substrate material 402 that is in close, but not touching, proximity to the silicon CMOS substrate 404. FIGS. 15A and 15C show a front-side illuminated configuration. FIG. 15B shows a backside illuminated configuration. Thus, both configurations are possible.

Object (Motion) Detection

As stated above, integration of signal at the detector can be separated for two amplifiers ("amplifier A" and "amplifier B") within one frame time, whereby it is possible to obtain useful information regarding motion within an imaged scene. In other words, moving objects in the scene can be detected using the combined outputs of the two circuits, where each circuit has an associated integration time that does not completely overlap the other. This section will explain this feature in further detail.

Detecting the motion of objects in the image scene can be achieved for either fast moving or slow moving targets. Slow moving objects would generally be detected by capturing frames of image data over extended periods of time, storing the images, and comparing (subtracting) image data through digital image processing techniques.

The motion of fast moving objects can be detected within a single frame time using the embodiments described above.

For the embodiment utilizing a single photodetector connected to two charge-to-voltage conversion amplifiers and separated by electronic shutter transistors (FIG. 5A), image data integrated on the detector with amplifier circuit 100 ("amplifier A") can be compared with image data integrated on the detector with amplifier circuit 200 ("amplifier B") by staggering the integration times of the amplifiers A and B and performing real time signal differentiation, i.e., subtraction, of the separate outputs of the two amplifiers. Since the data sets representing outputs of amplifiers A and B will typically have different gains, the amplifiers must first be calibrated and adjusted for balance so as to remove the effect of the gain offset difference from the output when the subtraction step is performed. A moving object will then be detected as a region of increased (or non-zero) signal one or more several pixels long or wide. Such objects can be distinguished from the zero signal background that occurs when gain-compensated detector outputs are subtracted from each other.

For the embodiment which uses two diode photodetectors (FIG. 9), each coupled to a separate charge to voltage conversion amplifier, where the first photodetector is connected to amplifier A and the second is connected to amplifier B, the same method of utilizing different integration times for the two amplifiers and performing real time signal differentiation to detect moving objects can be applied.

The detection range of object motion velocities may be affected by adjusting the frame rate and the pixel integration times for signal delivered to amplifier nodes A and B. Longer or shorter frame times would allow longer or shorter relative pixel exposure times and related capture of object motions.

Figure 18:
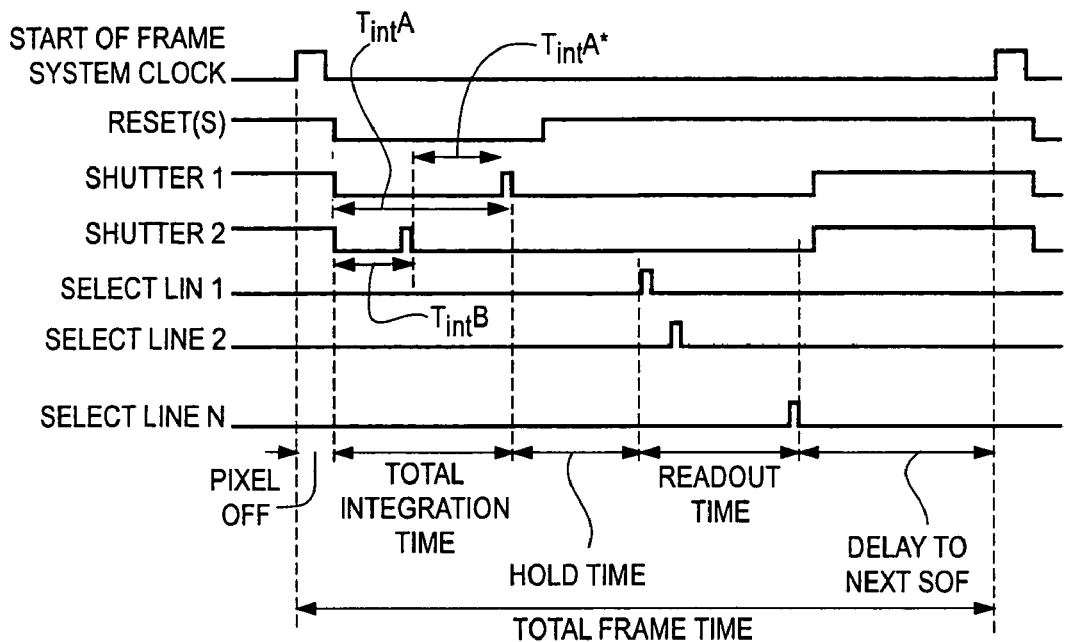
FIG. 18 is a timing diagram showing the timing of shutter signals during a complete frame using the techniques of FIGS. 16A and 16B.

The total frame time comprises the integration time, the time required to read out the imaging array, and other 'overhead time'. The total frame time (Ft) for a pixel with a single detector is the sum of the integration times for each amplifier ($T_{int}$ A and $T_{int}$ B), the readout time ($T_{ro}$), and the overhead time ($T_{oh}$), i.e., Ft=$T_{int}$ A+$T_{int}$ B+$T_{ro}$+$T_{oh}$. Referring now to FIG. 18, the exposure (integration) time may not simply be the time between the start and end of the integration period. If the pixel is operating in the non-integrating mode with the reset and shutter switches enabled (pixel off) when the start of frame timing pulse is generated, the detector will not integrate signal, and will not do so until the both the reset and shutter switches are turned off, which turns the pixel back on. Then, when the next shutter pulse occurs, integrated charge is transferred from the detector to the sense node(s). The time between the turning off of the reset and shutter signals and the next shutter pulse is the integration time for that node (A or B). In the case where sense nodes A and B are connected to a single detector through the two separate shutter switches, the integration of signal transferred to node A (or B) occurs before integration of signal transferred to node B (or A). In other words, for the single detector pixel case, the integration times are staggered such that node A or B integration cannot begin until the integration time for the other node is completed, and the effective integration time is sum of the integration times of nodes A and B as shown in FIG. 16A.

Figure 16A:
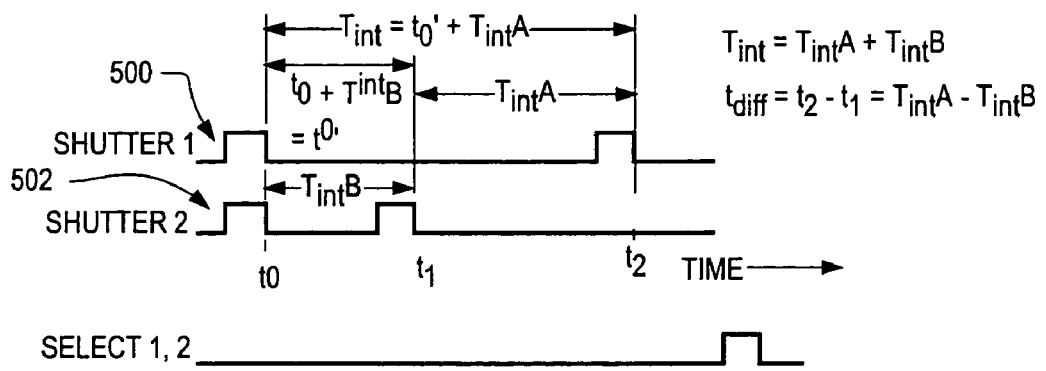
FIG. 16A is a timing diagram showing different integration times for first and second charge to voltage amplifier circuits in a single detector pixel, a feature which is useful for detecting a moving target in a scene.
Figure 16B:
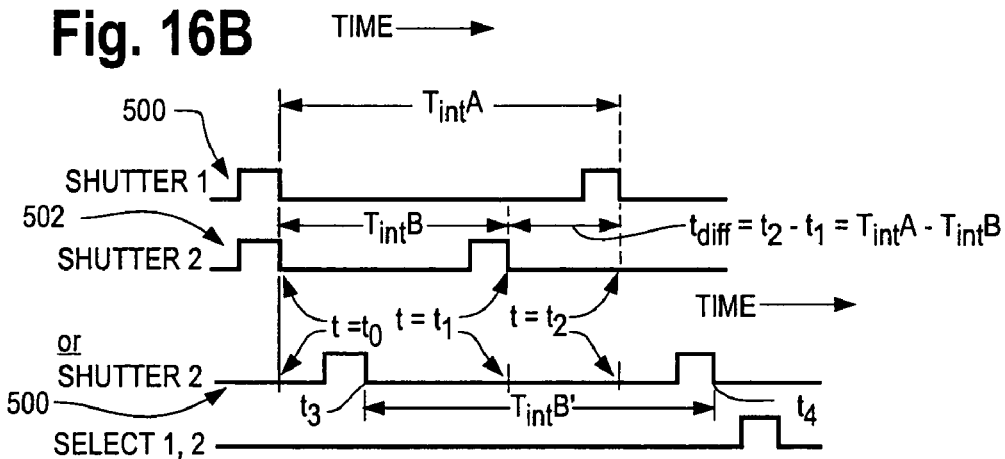
FIG. 16B is a timing diagram for a dual amplifier pixel with a two detector configuration operating in the moving target detection mode.

For the case where two detectors are contained within the pixel, integration of signals sent to nodes A and B can begin simultaneously and the effective integration time is the longer of the two integration times as shown in FIG. 16B. Referring to FIG. 18 again, one component of overhead time may result after the shutters have finished cycling, since there may be a delay before the start of the line 1 select clock pulse. As each line is selected, the horizontal scan circuit reads out the line 1 to line N signals through the horizontal shift register. Hence, the true total frame time includes the pixel off time, plus the effective integration time, plus whatever time delay there is between the last shutter switching off and the select pulse start/end (hold time), plus the full frame readout time, plus the whatever time delay between the end of the select N pulse and the start of the next frame start pulse. The pixel off time plus the time delays make up the 'overhead time', which can be minimized to zero, but there are often system reasons for having the frame time include a long interval of non-integration time in the pixel.

To summarize, the timing of the shutter integration pulse may be configured such that the photodetector/amplifier output circuits within each pixel contain signals from the scene with different integration windows. The difference in the integration windows allows for differentiation, i.e., subtraction, of the two separate data sets within the same frame. If nothing in the scene has moved within the differenced integration window, the result of subtracting the two data sets would be no signal (at least with balanced gain compensation). If an object in the field has moved within the time period of the differenced sub-frame time (field) integrations, a bright object would be detected from the subtraction of the data sets. Useful operation in the differencing mode would require that the focal plane array or camera platform incorporating the imager designs of this disclosure be stabilized, or fixed on a constant point during the time of integration as in the case of a moving airframe, since camera or ground motion would disturb the intra-field differentiation result. Methods and apparatus for stabilization of aerial reconnaissance and surveillance cameras are well known in the art and thus omitted in order to not obfuscate the present disclosure.

The moving target detection mode will now be illustrated conceptually with reference to FIGS. 16A-16B, 17, 18 and 19. As stated earlier, FIG. 16A shows the functional timing of a dual amplifier pixel with a single detector while FIG. 16B shows timing for a dual amplifier pixel with a two detector configuration operating in the target motion detection mode. The timing for the first amplifier shutter is indicated by the upper line 500; the timing for the second amplifier shutter is indicated by the lower line 502. For the two-detector pixel configuration (FIG. 16B), at time t0 integration of charge from the scene commences on both detectors. At time t1, the shutter for the second amplifier is closed, i.e., signal collection from the second detector ceases. However after time t1 signal collection still occurs in the first detector. At time t2, the shutter for the first amplifier is closed, i.e., signal collection in the first detector ceases. The difference in integration time between the two detectors is t2−t1 or Tint A−Tint B where signal values SA and SB are proportionate to I×t1 and I×t2 and I is the photon flux at the pixel which is considered constant for this illustration. The subtracted signal is therefore SA−SB=I×(t2−t1). For the case of a single detector being shared by the nodes A and B (FIG. 16A), the start of integration time t1 for node A must be delayed by t0' such that the start of integration for SA is t0+$T_{int}$B=t0'. Then, for t0=0, the integration time $T_{int}$B for signal SB must be t1 in duration. In this way the difference signal will still be I×(t2−t1) but the total length of time required to complete the integration cycle is increased by t0'. At some later time, a select voltage signal is applied to the pixel amplifiers (bottom line in FIGS. 16A, 16B) and the voltages representing the accumulated charge from the first and second amplifiers are transferred to the readout circuit. The above process occurs for every pixel in the imaging array.

Line 503 of FIG. 16B shows an alternative timing signal for the second amplifier shutter for the two detector pixel case which is staggered relative to the timing signal on line 500. The shutter signal on line 503 is offset from the shutter signal on line 500 by the time amount t3−t0. The integration time in this alternative embodiment ($T_{int}$ B') is the same as the integration time $T_{int}$ A, but is staggered in time. The timing for the shutter signal pulses is either staggered or overlapped such that there would be a difference in the starting time of integration for one detector vs. the second detector and/or a difference in the duration of the integration time. However, for either the two detector or single detector pixel, once signal is transferred to sense nodes A or B, the length of time that useable signal information can be held on the sense node of the associated amplifier after the integration time ends and the signal is read out is dependent on the leakage current of the node. As the signal is held on the node, the signal to noise ratio will decrease due to accumulating dark current shot noise. Therefore, it may be advisable to reduce the period t2−t1 to the minimum needed (and this may vary depending on light level and the luminance characteristics of the moving objects that are expected) and have the select signal occur immediately after the longest integration period ends. FIG. 18 shows all the timing signals for the embodiment in which the integration periods start at the same time but have different durations, indicated by $T_{int}$A, $T_{int}$B, and $T_{int}$A*.

Figure 17:
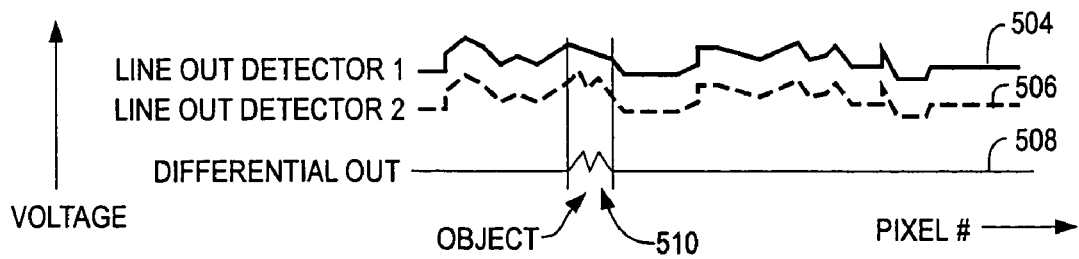
FIG. 17 is a graph of pixel output for two amplifier circuits from a single detector (or output from two amplifiers in a two detector embodiment), and the bottom line shows a differential output signal obtained by subtraction of the two detector signals with the non-zero differential signal (510) representing a moving target, using the timing feature of FIG. 16A or 16B.

FIG. 17 is a graph of pixel signal (voltage) across one line of pixels in an imaging array using the technique of FIG. 16B with timing lines 500 and 502. The upper line 504 of FIG. 17 indicates the signal from the first detector and the lower line 506 indicates the signal from the second detector. The two lines are separated from each other, but with gain compensation they would essentially have the same values, and if graphed, the lines would be superimposed over each other, except for those pixels where an object was moving in the scene during the integration period t2−t1. The pixel(s) imaging the moving object will have different detector outputs for each of the two detectors, and after the subtraction operation, would produce the non-zero difference signal at 510. The subtraction of the two pixels (and more preferably taking the absolute value of the signal difference), is indicated in the line 508 representing a difference signal. This signal has a null or close to null value for most pixels (with gain control), and the different detector outputs for the pixel representing the moving object is indicated at 510. The signal 510 thus indicates the moving object. Obviously, this technique explained in conjunction with FIG. 17 is performed for all the pixels in the imaging array.

Figure 19:
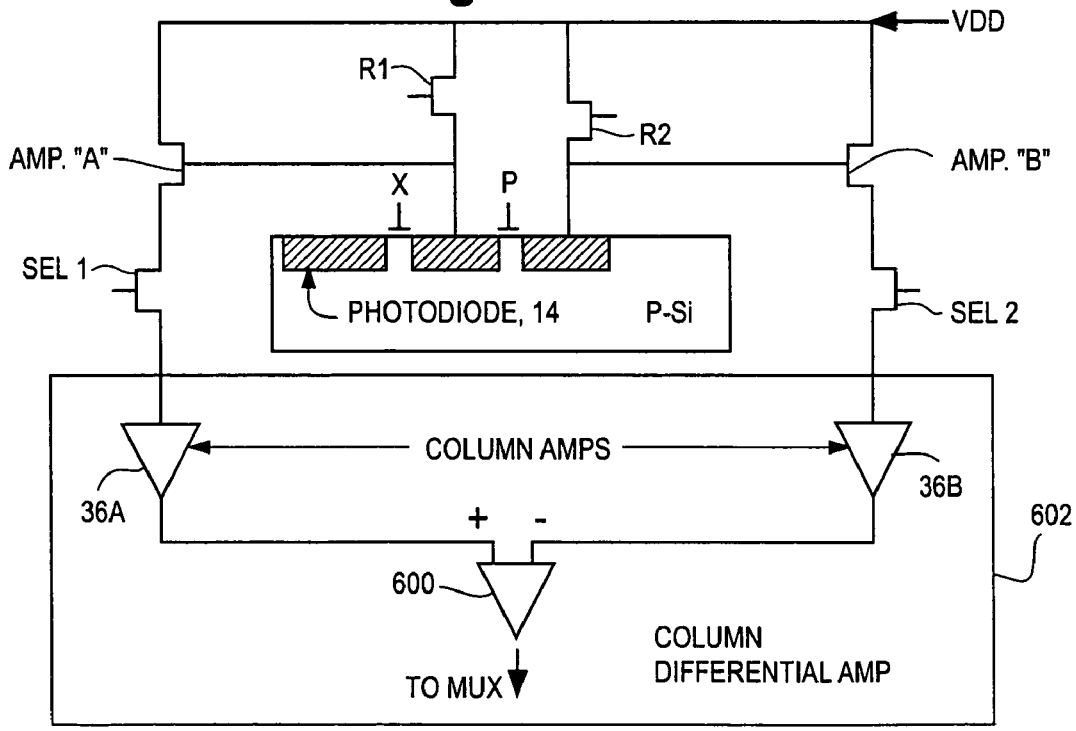
FIG. 19 is a schematic diagram of a pixel with a single detector, two charge to voltage conversion amplifiers and a differential column amplifier configuration whereby signal differentiation (subtraction) as shown in FIG. 17 to detect a moving object in the scene can be performed on-chip.

FIG. 19 is a schematic diagram of a pixel with a single detector 14, two charge to voltage conversion amplifiers "A" and "B" and select gates Sel 1 and Sel 2 which couple the amplifiers A and B to a readout circuit 602 having column amplifiers 36A and 36B, the output of which is supplied to a column differential amplifier 600 in the readout circuit 602. The output of the column differential amplifier 600 is a difference signal (FIG. 17) which is used to detect a moving object in the scene. The output signal from amplifier 600 is supplied to a multiplexer whereby a subtraction signal from all the pixels in a row of pixels is obtained. X and P are transfer gates for transferring charge from the photodiode detector 14 to the "A" and "B" amplifiers, respectively.

Signal differentiation (i.e., subtraction of detector output signals) could be achieved on-chip, i.e., in the pixel circuitry itself, by adding a differential amplifier between the two column amplifiers for each pixel detector pair as shown in FIG. 19. Alternatively, signal differentiation could be performed off-chip in a processing unit processing digital pixel values after gain compensation on the detector outputs has been performed.

Once moving objects in an image have been detected using the described signal subtraction procedure, the photodetector pixel addresses for the moving objects can be ascertained and such pixel addresses can be used for a variety of purposes including determination of the velocity and direction of the objects as well as geolocation. For example, using the known time difference between the integration shutter pulses (t2−t1), it is possible to calculate the velocity of the moving object by measuring the length of the trail of the differenced signal 510 (in terms of pixels) and translate that value into ground distance (by taking advantage of camera parameters such as focal length and the range from the camera to the ground), and then divide by the integration time difference t2−t1. Furthermore, the velocity of the direction the object is moving can also be ascertained. Other applications include but are not limited to scene change detection for locating brief events such as objects appearing/disappearing in the image, and for tracking the travel of high velocity projectiles. Such methods may take advantage of ranging and geolocation from imagery methods which are known in the reconnaissance art and therefore a detailed discussion is omitted for the sake of brevity.

It should be pointed out that the effectiveness of the detection of fast moving objects may be influenced by the range to the object and the associated system parameters including optical configuration and performance, image stabilization, signal to noise ratio, signal processing algorithms, and other related factors.

From the foregoing discussion, it will also be appreciated that a method of detecting motion in a scene with an imaging array having a plurality of pixels has been described. The array is capable of generating two images in a single exposure of the array to scene radiation (by means of the two amplifier circuit as explained above). The method comprises the steps of:

during the exposure of the array, in each pixel collecting a first image and a second image, wherein the first image and the second image are associated with image integration times which are not the same;

subtracting the first image from the second image to obtain a difference signal; and detecting motion in the scene from the difference signal.

The method is applicable to the single detector 14 per pixel embodiments as well as embodiments with two detectors 14 per pixel.

Hybrid IR Detector and CMOS Dual Amplifier Readout Integrated Circuit

A further embodiment is now described for improving the dynamic range of a high performance or reconnaissance grade infrared focal plane array (IRFPA) by applying the same inventive concepts to a CMOS Readout Integrated Circuit (ROIC), where the CMOS pixels containing the dual amplifier circuitry are now coupled to IR photodetectors outside the CMOS pixel. The combination of a readout IC coupled to external infrared detecting elements is referred to as a hybrid focal plane array.

The hybridized infrared focal plane arrays used in reconnaissance and surveillance imaging applications are subject to dynamic range performance requirements similar to those of the visible and near infra-red (Vis/NIR) CMOS image sensor arrays. Therefore, by using a CMOS ROIC, the CMOS pixel architecture containing the dual amplifier circuitry may also be applied to hybrid infrared focal plane technology to improve the dynamic range as described above. In other words, the CMOS pixel containing the dual amplifier circuitry as described in detail in the above embodiments may therefore be applied to a hybrid infrared focal plane technology. Such a hybrid infrared focal plane is expected to meet the demanding dynamic range performance requirements of aerial reconnaissance and surveillance applications and thus is an improvement over prior art.

The hybrid infrared focal plane array with CMOS dual amplifier readout integrated circuit replaces the visible spectrum photodiode 14 in the above embodiments with an IR detector and appropriate signal input scheme. The hybrid infrared focal plane array thus includes a first component which is an array of photodiode (or photoconductive) detectors fabricated on a separate substrate that is sensitive to infrared radiation. This array will be referred to as the IR detector array. The second component is the CMOS dual amplifier readout integrated circuit and may take the form of the embodiments of FIGS. 5-19 described above, except that the visible spectrum photodetector 14 in each pixel is replaced with a detector input node for detecting the IR signal output which is connected to the sense node of the dual amplifier circuits. Thus, each pixel in the CMOS ROIC includes a detector input node which receives the IR signal from an individual IR detector in the IR detector array. The IR detector array is bonded to the CMOS dual amplifier readout integrated circuit using one of several known hybridization technologies such as an indium bump interconnect technique, in which the IR photodetector output is indium bump bonded to the detector input node of the CMOS dual amplifier readout integrated circuit.

There are many types of hybrid infrared focal plane arrays using various forms of CMOS readout integrated circuits. One example presently developed by the assignee is a 2,000× 2,000 pixel array having InSb photodiodes Indium bump bonded to a CMOS time delay and integrate (TDI) readout integrated circuit. Some of the various other ROIC circuit schemes known in the art that may be employed in this embodiment include, but are not limited to, direct injection (DI), source follower per detector (SPD), capacitive transimpedance amplifier (CTIA), CCD, and Bucket Brigade time delay and integration (BBTDI). Each ROIC is generally designed with specific performance and configuration goals dictated by the application, and the selection of an appropriate input scheme for use in the present invention will vary depending on the application. Typically, infrared focal plane arrays operate at cryogenic temperatures to enable the IR detector to function with a low background or dark signal level.

Infrared detector elements (pixels) tend to be larger in size than visible spectrum pixels due to the larger diffraction limits, detector sensitivity, and indium bump spacing (pitch) limitations. Signal input schemes that couple the IR detector to the CMOS ROIC are therefore designed to provide proper IR detector bias while transferring signal to the ROIC with optimum signal to noise ratio, linearity, and other optimized electrical performance factors.

In the preferred embodiments, signals generated by the infrared radiation detection elements of the IR detector array are coupled to the input diodes or input nodes of the CMOS pixels containing the dual amplifier circuitry using optimal detector biasing and input schemes such that the signal integration, detection, amplification and readout concepts used to achieve increased dynamic range, as described in the prior application Ser. No. 11/030,843 (described above) are achieved for the case of the IR detector array. The technologies used for the design of IR detector arrays, hybridization interconnects, and input schemes for an associated ROIC are sufficiently described in the prior art for hybridized IR focal plane arrays and will not be detailed here. Such prior art references include: U.S. Pat. Nos. 5,128,534 and 6,593,562 and the publication "Focal-Plane-Arrays and CMOS Readout Techniques of Infrared Imaging Systems" IEEE Trans. on Circuits and Systems for Video Technology, 1997.

In summary, the visible spectrum photodiode detector 14 described in the embodiments of FIGS. 5-15 is replaced by a hybridized IR photodetector with an appropriate biasing and input coupling scheme to couple IR signals, through the detector input node, to the sense node of the dual amplifier circuitry. Signal charge that is transferred from the IR photodetector element to the sense node of the dual amplifier circuits is therefore treated in the same manner as that of the signal generated by the visible photodetector 14 in the embodiments described above, to thereby achieve increased dynamic range of the hybrid focal plane array. This is possible because the benefits of the dual output amplifier concept for achieving the improved dynamic range is, essentially, independent of the source of the signal charge (electrons). Thus, replacing the visible photodiode detectors 15 of FIGS. 5-15 with hybridized infrared detectors achieves the same result of enhancing dynamic range performance of the focal plane array.

As a further embodiment, the IR detector array could include two IR detectors per CMOS pixel, one providing a signal to a first amplifier circuit optimized for a linear response to high light level input signals and one for providing a signal to a second amplifier circuit optimized to provide a high signal to noise ratio for low light level input signals.

Since the operation of the dual amplifier circuitry 100, 200 in each CMOS ROIC pixel will be the same as for the visible photodetector case, the same output signal processing features are available. The signal outputs from either the higher gain or larger full well amplifiers may be similarly recorded simultaneously, individually, or differentially in the manner as described previously to provide the desired output signal. As a further example of this, the output of the CMOS ROIC could be used for target motion detection for a scene imaged in the IR using the hybrid infrared focal plane array, using the target motion detection concepts explained above.

The CMOS amplifier design parameters for capacitances and voltage swing values would most likely remain the same for the Vis/NIR and IR focal plane implementations. However, any differences in circuit parameter design would depend on the signal levels anticipated, the pixel pitch, the CMOS processing technology, operational frame rate, and other implementation and configuration-specific parameters.

Figure 20:
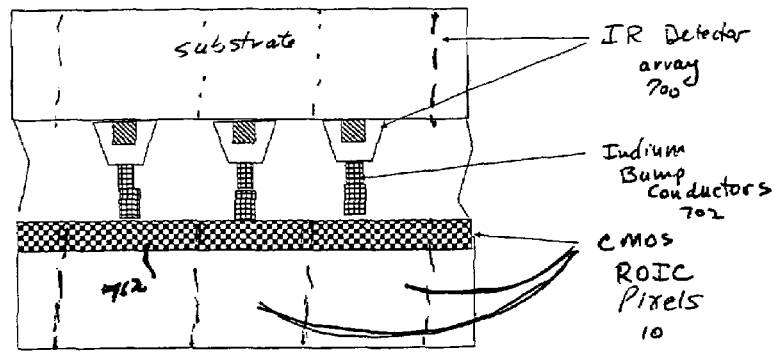
FIG. 20 is a cross-sectional view of a hybrid IR image sensor comprising an IR detector array bonded to a CMOS dual amplifier and readout integrated circuit.

FIG. 20 is a cross-sectional view of a hybrid IR image sensor comprising an IR detector array 700 bonded to a CMOS dual amplifier and readout integrated circuit comprising a plurality of pixels 10 via indium bump bond conductors 702. The IR detector array 700 is fabricated on a non-silicon substrate such as Indium Antimonide (InSb) or Mercury Cadmium Telluride (HgCdTe) or other IR sensing material. This substrate is aligned, pressed into contact, and glued to a matching CMOS readout integrated circuit comprising a plurality of pixels 10 arranged in rows and columns. Electrical contact from the IR detector element to the matching CMOS readout pixel 10 is achieved using an interconnect material such as patterned indium bump conductors (C) that are patterned on both the ROIC and IR detector substrates.

In the embodiment of FIG. 20, there is one. IR detector per CMOS ROIC pixel 10. However, as noted below, it may be possible to include two IR detectors per CMOS pixel, one supplying charge to a first amplifier circuit and the other IR detector supplying charge to a second amplifier circuit, for example as shown in the embodiment of FIG. 9 by substituting IR detectors for the visible detectors 14 and using the construction shown in FIG. 20.

Figure 21:
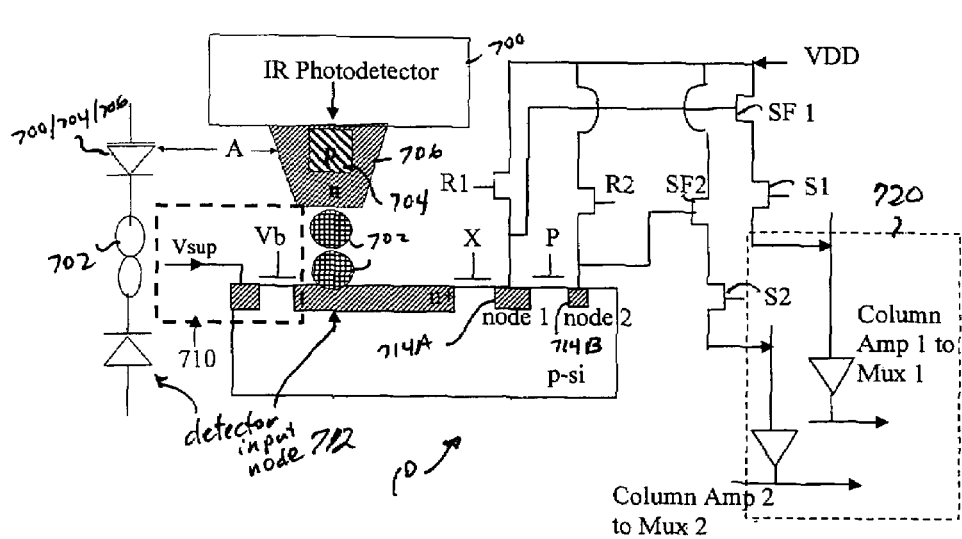
FIG. 21 is a schematic view, partially in cross-section, of the embodiment of FIG. 20, showing one possible arrangement of the CMOS dual amplifier readout circuit.

FIG. 21 is a schematic view, partially in cross-section, of the embodiment of FIG. 20, showing one possible arrangement of single pixel 10 in the CMOS dual amplifier readout circuit. The IR photodetector includes the IR substrate 700, and a region of P-type silicon surrounded by a region of N-type silicon. The detector 700/704/706 is bonded by indium bumps 702 to a detector input node 712 shown as N+ type silicon in the CMOS ROIC pixel. An optional biasing circuit 710 may be included in the readout pixel 10 to provide a voltage bias to the detector through the detector input node 712. A variety of biasing circuits are possible for circuit 710. The illustrated biasing circuit 710 is a MOSFET transistor with a drain and a gate connecting a supply of voltage/current Vsup to the detector input node 712. The bias to the detector input node 712 would be controlled by the transistor gate Vb.

The input node 712 is the detector input node of the CMOS ROIC pixel 10 and accumulates charge from the IR detector 700/704/706 during exposure of the IR detector. A transfer gate X transfers charge from the input node 712 to a first sense node 714A which is coupled to a first amplifier circuit including first source follower amplifier SF1. Transfer gate P acts to transfer charge from the input node 712 to a second sense node 714B. The second sense node 714B is coupled to a second amplifier circuit including source follower amplifier SF2.

The first circuit including sense node 714A and amplifier SF1 is optimized for a linear response to high light level input signals. The amplifier SF1 also functions as a charge to voltage conversion circuit. The second circuit including sense node 714B and amplifier SF2 is optimized to provide a high signal to noise ratio for low light level input signals. The second amplifier SF2 circuit functions as a charge to voltage conversion circuit. R1 and R2 are reset transistor gates.

The pixel 10 also includes a first output select transistor gate S1 for selectively directing the output of the first circuit (amplifier SF1) to an output circuit 720 including a column amplifier and multiplexer for outputs of all the first amplifier circuits in the array. The pixel 10 also includes an output select transistor gate S2 for selectively directing the output of the second circuit (amplifier SF2) to the output circuit 720 and to a second column amplifier and second output multiplexer. While FIG. 21 shows one example of a dual amplifier circuit including amplifiers SF1 and SF2, the construction of the dual amplifier circuits and output select circuits may take the various forms as described previously in conjunction with FIGS. 5-15 or 19.

From the foregoing, and with reference to FIGS. 20 and 21, it will be appreciated that a method of imaging a scene with a hybrid imaging array comprising an array of IR detectors and a CMOS readout integrated circuit has been described. The array of IR detectors 700 and corresponding pixels of the CMOS readout integrated circuit are arranged in a plurality of rows and columns. The method includes performing the following steps in each pixel 10:

a) directing scene illumination onto an IR detector 700/704/706 in the array of IR detectors;

b) supplying a signal from the IR detector 700/704/706 to a detector input node 712;

c) supplying charge from detector input node 712 through a first transfer gate X to a relatively low gain, wide dynamic range amplifier circuit SF1 and generating a first output (from source follower amplifier SF1);

d) supplying charge from the detector input node 712 through a second transfer gate P to a relatively high gain, limited dynamic range amplifier circuit SF2 and generating a second output signal (from the second source follower amplifier SF2); and e) clocking a first output select gate S1 and a second output select gate S2 so as to separately transfer the first output signal of said first circuit and the second output of the second circuit to a first output multiplexer ("Mux 1") and a second output multiplexer ("Mux 2"), respectively.

As noted above, it is conceivable to have two IR detectors "A" and "B" bump bonded to two different input circuits within the readout IC pixel 10 such that a detector A signal would be read out through amplifier A and a detector B signal would be read out through an amplifier B, basically modifying the embodiment of FIG. 9 to include one IR detector and input node for detector 14A and another IR detector and separate input node for detector 14B.

The practical reality is that indium bump bond technology is presently too crude, in terms of definition of bumps, to allow for two physical indium bumps, plus the spacing required to isolate two bumps once they are brought into contact (somewhat squashed together) to achieve a satisfactory pixel size for most applications. For example, a common infrared pixel pitch is 20 microns to 25 microns center to center. Mostly this pitch is dictated by IR optics diffraction limits, detector performance, and the minimum indium bump that can be practically bump bonded. The indium bump might be patterned to 12 or 15 microns, then the bump expands laterally, to approximately 16 to 18 microns, when the detector and silicon substrates are brought into contact. Hence, in order to avoid shorting of indium bumps, there must be sufficient spacing of bumps.

If two detectors were to be used for each CMOS readout pixel, and two indium bumps were required per CMOS pixel, either the pixel pitch would need to grow to 40 to 50 microns (which is not acceptable for most applications for many reasons) or the indium bump technology would need to be upgraded to pattern indium bumps at 5 to 7 microns. Currently, the indium bump technology has not been engineered to produce indium bumps smaller than about 10 microns (in experimental prototypes). One of the main reasons for the difficulty of reducing the size of indium bumps is that the bump must also have a thickness (height) that is about 10 to 15 microns. This is because the two substrates that are brought in contact are rarely more planar or flat than to 15 microns to 20 microns. This' issue is that the indium bump cannot be patterned to a smaller lateral dimension than its thickness or height (aspect ratio of 1). So, using today's bump bonding technology, the spacing of the two detectors would be impractical at least for many applications, but future hybridization technologies might overcome the bump spacing limitation. Accordingly, it may be advisable to use some other interconnect technique to join two IR detectors to a single CMOS ROIC pixel.

In a two IR detector to one CMOS pixel embodiment, each of the pixels comprises a first detector input node for receiving a signal from a first one of the two IR detector elements and a first relatively lower gain, wide dynamic range amplifier circuit responsive to signal received at the first detector input node, the first circuit optimized for a linear response to high light level input signals. Further, the pixel will include a second detector input node for receiving a signal from a second one of the two IR detector elements and a second relatively higher gain, lower dynamic range amplifier circuit responsive to signal received at the second detector input node, the second circuit optimized to provide a high signal to noise ratio for low light level input signals. The pixel will also include a first output select circuit for selectively directing the output of the first circuit to a first output multiplexer provided for the imaging array; and a second output select circuit for selectively directing the output of the second circuit to a second output multiplexer provided for the imaging array. The first and second circuits and the output select circuits may take any of the various forms described previously in the drawings.

Presently preferred and alternative embodiments to this invention have been described. However, variation from the specifics of the disclosed embodiments is contemplated without departure from the scope of the invention. For example, while CMOS pixels have been described with one and two individual photodetectors, it is contemplated that additional photodetector (3, 4, or more in all) could be used. Additionally, it would be possible to utilize three or more different amplifier circuits and three or more separate output circuits, one per photodetector.

I claim:

1. A hybrid imaging array comprising an array of infrared (IR) detector elements coupled to a CMOS readout integrated circuit having pixels arranged in a plurality of rows and columns, wherein each infrared detector element in the array of infrared detector elements is electrically coupled to a corresponding pixel in the array of CMOS pixel elements in the readout circuit, and wherein each of the pixels comprises:
   a) a detector input node for receiving a signal from the IR detector element and generating a signal output;
   b) a first relatively lower gain, wide dynamic range amplifier circuit coupled to the detector input node, the first circuit having a first sense node and a first amplifier, the first circuit optimized for a linear response to high light level input signals;
   c) a second, independent, relatively higher gain, lower dynamic range amplifier circuit coupled to the detector input node, the second circuit having a second sense node and a second amplifier, the second circuit optimized to provide a high signal to noise ratio for low light level input signals;
   d) a first output select circuit for directing the output of the first amplifier circuit to a first output multiplexer;
   e) a second, independent, output select circuit for directing the output of the second independent amplifier circuit to a second output multiplexer;
   wherein separate outputs of the first and second circuits are provided for each of the individual pixels of the CMOS readout integrated circuit such that a signal from each of the first and second amplifier circuits can be independently and simultaneously read out from the pixel.

2. The imaging array of claim 1, wherein the first and second amplifier circuits comprise a charge to voltage conversion circuits.

3. The imaging array of claim 1, wherein the imaging array generates a frame of imagery, and wherein for the frame, each pixel produces output voltages from both the first and second circuits.

4. The imaging array of claim 1, wherein each pixel comprises one detector input node and wherein each pixel comprises first and second transfer gates for transferring charge from the detector input node to the first and second amplifier circuits, respectively.

5. The imaging array of claim 1, wherein the first amplifier circuit and the second amplifier circuit comprise a source follower amplifier circuit having an input gate and wherein the first and second circuits further comprise a sense node capacitance Cnode 1 and Cnode 2, respectively, and wherein each sense node capacitance is comprised of the sum of cumulative parasitic capacitances and fixed capacitances, if any, present at the input gate of the source follower amplifier circuit of each first and second amplifier circuit, each sense node capacitance accumulating charge from the detector input node.

6. The imaging array of claim 5, wherein Cnode 1 of the first amplifier circuit and Cnode 2 of the second amplifier circuit have different capacitance values, and wherein the capacitance value of Cnode 1 is optimized for a relatively large charge accumulation such that it can accommodate the signal charge associated with the largest output signal from the IR detector, and wherein the capacitance of Cnode 2 is substantially smaller than the capacitance of Cnode 1 to thereby provide larger charge to voltage gain by the source follower amplifier circuit of the second circuit.

7. The imaging array of claim 6, wherein the capacitance Cnode 1 further comprises a fixed capacitor providing for additional charge accumulation from the photodetector.

8. The imaging array of claim 1, wherein the infrared detector elements are indium bump bonded to the detector input nodes of corresponding pixels in the CMOS readout integrated circuit.

9. A hybrid imaging array comprising an array of infrared detector elements coupled to a CMOS readout integrated circuit having pixels arranged in a plurality of rows and columns, wherein at least two infrared (IR) detector elements are electrically coupled to a single corresponding pixel for each of the pixels in the CMOS readout integrated circuit; and wherein each of the pixels comprises:
  a) a first detector input node for receiving a signal from a first one of the two IR detector elements;
  b) a first relatively lower gain, wide dynamic range amplifier circuit responsive to a signal received at the first detector input node, the first circuit having a first sense node and a first amplifier, the first circuit optimized for a linear response to high light level input signals;
  c) a second detector input node for receiving a signal from a second one of the two IR detector elements;
  d) a second, independent, relatively higher gain, lower dynamic range amplifier circuit responsive to a signal received at the second detector input node, the second circuit having a second sense node and a second amplifier, the second circuit optimized to provide a high signal to noise ratio for low light level input signals;
  e) a first output select circuit for selectively directing the output of the first circuit to a first output multiplexer provided for the imaging array;
  f) a second, independent, output select circuit for selectively directing the output of the second independent circuit to a second output multiplexer provided for the imaging array;
  wherein separate outputs of the first and second circuits are provided for each of the individual pixels of the imaging array such that a signal from each of the first and second amplifier circuits can be independently and simultaneously read out from the pixel.

10. The imaging array of claim 9, wherein the first amplifier circuit and the second amplifier circuit each comprise a charge to voltage conversion circuits.

11. The imaging array of claim 9, wherein the CMOS readout integrated circuit generates a frame of imagery, and wherein for each frame, each pixel produces output voltages from both the first and second circuits.

12. The imaging array of claim 9, wherein the first amplifier circuit and the second amplifier circuit comprise a source follower amplifier circuit having an input gate and wherein the first and second circuits further comprise a sense node capacitance Cnode 1 and Cnode 2, respectively, and wherein each sense node capacitance is comprised of the sum of cumulative parasitic capacitances and fixed capacitances, if any, present at the input gate of the source follower amplifier circuit of each first and second amplifier circuit, each sense node capacitance accumulating charge from the detector input node.

13. The imaging array of claim 9, wherein Cnode 1 of the first amplifier circuit and Cnode 2 of the second amplifier circuit have different capacitance values, and wherein the capacitance value of Cnode 1 is optimized for a relatively large charge accumulation such that it can accommodate the signal charge associated with the largest output signal from the IR detector, and wherein the capacitance of Cnode 2 is substantially smaller than the capacitance of Cnode 1 to thereby provide larger charge to voltage gain by the source follower amplifier circuit of the second circuit.

14. The imaging array of claim 13, wherein the capacitance Cnode 1 further comprises a fixed capacitor providing for additional charge accumulation from the photodetector.

15. The imaging array of claim 12, wherein the first circuit further comprises a transfer gate isolating Cnode 1 from the first detector input node and wherein the second circuit further comprises a transfer gate isolating Cnode 2 from the second detector input node.

16. A method of imaging a scene with a hybrid imaging array comprising an array of infrared (IR) detectors and a CMOS readout integrated circuit having and array of pixels, each IR detector being electrically coupled to a corresponding pixel in the CMOS readout integrated circuit, where the pixels are arranged in a plurality of rows and columns, comprising performing the following steps in each pixel:
  a) directing scene illumination onto an IR detector in the array of IR detectors;
  b) supplying a signal from the IR detector to a detector input node;
  c) supplying charge from the detector input node through a first transfer gate to a relatively low gain, wide dynamic range amplifier circuit and generating a first output signal, the low gain, wide dynamic range amplifier circuit having a first sense node and a first amplifier, the low gain wide dynamic range amplifier circuit optimized for a linear response to high light level input signals;
  d) supplying charge from the detector input node through a second transfer gate to a relatively high gain, limited dynamic range amplifier circuit and generating a second output signal, the high gain limited dynamic range amplifier circuit having a second sense node and a second amplifier, the high gain limited dynamic range amplifier circuit optimized for a high signal to noise ratio for low light level input signals; and
  e) clocking a first output select gate and a second output select gate so as to separately transfer the first output signal and the second output signal to a first output multiplexer and a second output multiplexer, respectively, wherein the first and second output signals may be independently and simultaneously read out from the pixel.

17. The method of claim 16, further comprising the step of detecting a moving object in the scene from the outputs of the first and second amplifier circuits.

18. The method of claim 17 wherein the charge from the input node is integrated for a different time period by the first and second amplifier circuits, within the same image frame time; and where the location of the object in the scene as contained in each of the outputs is compared to detect movement of the object.

* * * * *